(12) United States Patent
Sakata et al.

(10) Patent No.: US 6,372,859 B1
(45) Date of Patent: Apr. 16, 2002

(54) THERMORESISTANCE ADHESIVE AND SEMICONDUCTOR DEVICE USING THE SAME

(75) Inventors: Touichi Sakata, Hitachnaka; Hiroshi Nishizawa, Kitaibaraki; Keizo Hirai, Hitachiota; Kenji Suzuki, Hitachi, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/424,550

(22) PCT Filed: May 28, 1998

(86) PCT No.: PCT/JP98/02361

§ 371 Date: Nov. 26, 1999

§ 102(e) Date: Nov. 26, 1999

(87) PCT Pub. No.: WO98/54267

PCT Pub. Date: Dec. 3, 1998

(30) Foreign Application Priority Data

May 30, 1997 (JP) ............................... 9-142251
May 30, 1997 (JP) ............................... 9-142252

(51) Int. Cl.$^7$ ............................................. C08L 77/00
(52) U.S. Cl. .................... 525/432; 525/436; 524/538
(58) Field of Search ............................... 525/432, 436; 524/538

(56) References Cited

U.S. PATENT DOCUMENTS

| 5,037,862 A | | 8/1991 | Nishizawa et al. | .......... 523/223 |
| 5,164,816 A | * | 11/1992 | Nishizawa et al. | .......... 257/759 |
| 5,294,835 A | | 3/1994 | Igarashi et al. | .............. 257/793 |
| 5,406,124 A | | 4/1995 | Morita et al. | ................ 257/783 |
| 5,912,316 A | * | 6/1999 | Nguyen et al. | ................ 528/93 |

FOREIGN PATENT DOCUMENTS

| EP | 0384036 | 8/1990 |
| EP | 0618614 | 10/1994 |
| JP | 6440570 | 2/1989 |
| JP | 2-36542 | 2/1990 |
| JP | 4-85379 | 3/1992 |

* cited by examiner

*Primary Examiner*—James J. Seidleck
*Assistant Examiner*—Melanie D. Bagwell
(74) *Attorney, Agent, or Firm*—Antonelli, Terry, Stout & Kraus, LLP

(57) ABSTRACT

A thermoresistance adhesive which does not dissolve in the sealer-composing resins at the sealer molding temperature and is capable of providing a semiconductor chip/lead frame adhesive strength under shear of 1 N/4 mm$^2$ or greater, and including, for example, amide, imide, ester or ether linkage is suited for use in producing thermoresistance adhesive solutions and thermoresistance resin pastes, and the semiconductor chips, lead frames, films, etc., made by using such an adhesive are suited for providing low-cost semiconductor devices.

5 Claims, 1 Drawing Sheet

THERMORESISTANCE ADHESIVE AND SEMICONDUCTOR DEVICE USING THE SAME

TECHNICAL FIELD

The present invention relates to a thermoresistance adhesive, a thermoresistance adhesive solution, a thermoresistance resin paste, a process for the preparation thereof, a semiconductor chip having a thermoresistance adhesive layer, a lead frame having a thermoresistance adhesive layer, a film having a thermoresistance adhesive layer, and a semiconductor device.

BACKGROUND ART

The resin-sealed semiconductor devices are typically of the structures such as illustrated in FIGS. 1 to 3. A thermoresistance adhesive is used for bonding the inner leads of a lead frame to a semiconductor chip in the semiconductor device of FIG. 1, or bonding the inner leads of a lead frame which doubles as a buffer coat to the chip surface in the semiconductor device of FIG. 2. In an ordinary semiconductor device shown in FIG. 3, the said adhesive is utilized for bonding a lead frame tab (die pad) to the back side of a chip. The structures of the semiconductor devices of the type illustrated in FIGS. 1 and 2 are called lead-on-chip (LOC) structure, and the thermoresistance adhesive used therefor is required to be capable of providing secure bonding (especially heat bonding) of the chip and lead frame and to also have enough adhesiveness to the sealer to prevent package cracking in solder reflowing.

Recently, with advancement of miniaturization of semiconductor devices, the proportion of the chips in the semiconductor devices has increased while the rate of the sealer used in such devices has decreased, and this situation is blamed for the frequent occurrence of package cracking, a phenomenon caused as the moisture absorbed in the thermoresistance adhesive or sealer is vaporized and expanded by the heat such as generated from soldering treatment (solder reflowing). In order to prevent such a phenomenon, it has been attempted to lower hygroscopicity or elevate glass transition temperature of the thermoresistance adhesive and to split the adhesive mass into a plurality of small pieces, thereby allowing escape of the water vapors in solder reflowing to prevent cracking (JP-A 3-109757). With the conventional adhesives, however, it has been hardly possible to provide both secure bonding (especially heat bonding) of the chip and lead frame and enough adhesiveness to the sealer to prevent package cracking in solder reflowing.

The heat-resistant resins such as polyimide resins have already been widely used for surface protective films, interlaminar insulating films, etc., of semiconductor elements in the field of electronics as these resins have excellent mechanical properties as well as high heat resistance. Recently, as means for forming an image on such polyimide films, attention is focussed on screen printing which can dispense with such steps as exposure, development and etching. A thixotropic heat-resistant resin paste composed of a filler, a binder and a solvent is used for screen printing. In most of the hitherto developed thermoresistance resin pastes, fine silica particles or non-soluble fine polyimide particles are used as the filler for affording the thixotropic properties, so that these resin pastes involve the problem that many voids or air cells are formed at the filler interface during heat drying to lower the film strength. There have been developed the thermoresistance resin pastes (such as the one disclosed in JP-A 2-289646) which are free of such problems and capable of forming a high-quality polyimide pattern by using a combination of an organic filler (soluble filler), a binder and a solvent, in which in the course of heat drying, the filler is first dissolved and then compatibilized with the binder to form a film. In production of this type of resin paste, mechanical milling such as roll milling is required as means for mixing and dispersing the fine silica particles or non-soluble polyimide particles and a specific organic filler (soluble filler) in a binder/solvent solution. According to this method, however, dust or other ionic impurities tend to mix in the thermoresistance resin paste from the mixer and/or the mixing atmosphere, so that this technique was unsuited for such uses as production of semiconductor elements and also unsatisfactory in terms of productivity. Further, since the specific organic filler (soluble filler) is generally produced by a reprecipitation method in which a dilute polyimide resin solution is supplied into a poor solvent of the polyimide resin and the precipitated fine solid particles are recovered, the process was complicated and low in productivity.

DISCLOSURE OF INVENTION

An object of the present invention is to solve these problems and to provide a thermoresistance adhesive which is capable of providing secure bonding (especially heat bonding) of a chip and a lead frame and also has sufficient adhesiveness to the sealer to prevent package cracking in solder reflowing, a solution of such a thermoresistance adhesive, and a semiconductor chip having a thermoresistance adhesive layer, lead frame having a thermoresistance adhesive layer, a film having a thermoresistance adhesive layer, and a semiconductor device.

Another object of the present invention is to provide a thermoresistance resin paste which is capable of affording the thixotropic properties to said elements with no need of using a filler such as fine silica particles or non-soluble polyimide particles, and also makes it possible to form a pattern uniform in thickness, high in reliability and free of voids or air cells by screen printing, and a process for producing such a thermoresistance resin paste containing few contaminants such as dust or ionic impurities with high productivity.

Thus, the present invention provides a thermoresistance adhesive to be used for bonding a semiconductor chip and a lead frame in a resin-sealed type semiconductor device, characterized in that the said adhesive does not dissolve in the sealer composing resins at the sealer molding temperature, and that its semiconductor chip/lead frame adhesive strength under shear is 1 N/4 mm$^2$ or greater.

The present invention further provides a thermoresistance adhesive solution containing an organic solvent in addition to the said components of the said thermoresistance adhesive.

It is also envisaged in this invention to provide a thermoresistance resin paste comprising (A) a heat-resistant resin having a hydroxyl group, an amino group or a carboxyl group in the molecule, (B) fine organic particles, (C) a crosslinking agent having functional groups chemically bondable to the said hydroxyl, amino or carboxyl group, and (D) a solvent, characterized in that before heat drying, the fine organic particles (B) exist as a heterogeneous phase as opposed to the homogeneous phase composed of the heat-resistant resin (A), crosslinking agent (C) and solvent (D), and after heat drying, there is formed a homogeneous phase containing the heat-resistant resin (A), fine organic particles (B) and crosslinking agent (C) as essential components.

The present invention further provides a thermoresistance adhesive obtained by drying either the said thermoresistance adhesive solution or the said thermoresistance resin paste.

The present invention also provides a semiconductor chip having a thermoresistance adhesive layer produced by providing a layer of said thermoresistance adhesive on the circuit forming side of a semiconductor chip.

The present invention further provides a lead frame having a thermoresistance adhesive layer produced by providing a layer of said thermoresistance adhesive on the semiconductor chip-mounted side of a lead frame.

The present invention further provides a film having a thermoresistance adhesive layer produced by providing a layer of said thermoresistance adhesive on one or both sides of a support film.

The present invention is also intended to provide a semiconductor device in which the plural inner leads of a lead frame are bonded to the circuit-forming side of a semiconductor chip by the said thermoresistance adhesive, and the semiconductor chip and the inner leads of the lead frame are electrically connected by wire bonding, said semiconductor chip being sealed by a sealant.

The present invention further provides a process for producing a thermoresistance resin paste which comprises mixing (I) a heat-resistant resin A soluble in the solvent of (III) at room temperature and at the heat drying temperature, (II) a heat-resistant resin B which is insoluble in the solvent of (III) at room temperature but soluble at the heat drying temperature, and (III) a solvent, dissolving the said materials by heating, and cooling the obtained soluble to have the fine particles of the heat-resistant resin B of (II) precipitated and dispersed in the solution of the heat-resistant resin A of (I) and the solvent of (III).

BEST MODE FOR CARRYING OUT THE INVENTION

Figure 1:
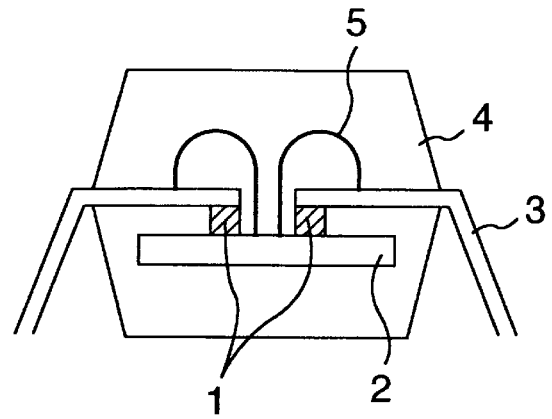
FIG. 1 is a schematic illustration of a structure of the semiconductor device of this invention in which the semiconductor chip is positioned on the lower side of the lead frame.

As a result of the studies on the relationship between package cracking in solder reflowing of a moisture-absorbed semiconductor device and adhesiveness of the thermoresistance adhesive used therefor, the present inventors found that the main causative factor of package cracking is solubility of the adhesive in the sealer-composing resins at the sealer molding temperature, rather than hygroscopicity or glass transition temperature of the adhesive, and that the problem of such package cracking can be overcome by using a thermoresistance adhesive which does not dissolve in the sealer-composing resins at the sealer molding temperature. This finding provides the basis of the present invention.

Generally, in case of using a thermoresistance adhesive of the type which dissolves in the sealer-composing resins at the sealer molding temperature, exfoliation is liable to take place at the interface between the adhesive and the sealer even before the solder reflowing step, encouraging the tendency for package cracking to occur. Further, such a thermoresistance adhesive which dissolves in the sealer-composing resins forms a molten fluid with the sealer under high temperature (200° C. or above) in solder reflowing, which tends to cause blistering and cracking of the package. On the other hand, simple affording of thermosetting properties to the thermoresistance adhesive as means for lowering its solubility in the sealer-composing resins, although effective for improving the package cracking tendency, poses the problem that the adhesive force (especially in heat bonding) of said adhesive to the semiconductor chip or lead frame is weakened. It has never been anticipated that use of a thermoresistance adhesive which does not dissolve in the sealer-composing resins at the sealer molding temperature and has adhesiveness (especially heat bondability) to the semiconductor chip or lead frame should be effective for improving package cracking resistance of the semiconductor devices.

The present invention comprehends the following embodiments.

(1) A thermoresistance adhesive to be used for bonding a semiconductor chip and a lead frame in a resin-sealed type semiconductor device, characterized in that the adhesive does not dissolve in the sealer-composing resins at the sealer molding temperature, and that its adhesive strength under shear between a semiconductor chip and a lead frame is 1 N/4 mm$^2$ or greater.

The expression "does not dissolve in the sealer-composing resins" used here is defined as follows. A glass plate (about 2 mm thick) having a 20 μm thick layer of the thermoresistance adhesive is heated to 180° C., then about 0.1 g of pellets of each sealer-composing resin are placed on the thermoresistance adhesive layer and allowed to stand at 120 to 200° C. for 2 minutes, after which the molten sealer-composing resin left on the adhesive is wiped out at the same temperature and the appearance of the adhesive layer is visually observed. The above expression applies either when only a trace of dissolution is admitted at the part of the adhesive layer contacted with the resin pellets or when absolutely no sign of dissolution is admitted. On the other hand, the expression "dissolves in the sealer-composing resins" signifies the case where the thermoresistance adhesive dissolves in the sealer-composing resins to form a molten fluid to create hollows or holes in the adhesive film. It is desirable that the adhesive does not dissolve in any of the component resins used, but when the resins are used as a mixture, it is merely required that the adhesive be not dissolved in the mixture per se.

The semiconductor chip/lead frame adhesive strength under shear of the thermoresistance adhesive is measured at 25° C. and a tear-off rate of 0.5 mm/sec, using a test piece made by bonding said both members with interposition of a 20 μm adhesive layer under the conditions of 300° C., 0.2 MPa and 5 seconds.

The "semiconductor chip" generally refers to the one comprising a 670 μm thick silicon wafer having electronic circuits formed thereon or a piece cut out therefrom, but the chips contemplated in the present invention are not limited to this type; the bonded side of the chip may comprise a silicon oxide film or a buffer coat of a heat-resistant resin such as polyimide resin. The lead frame is usually of the type made of an iron (Fe)/nickel (Ni) alloy (an alloy with Ni content of 42%, hereinafter referred to as 42 alloy), but are not limited to this type. For measurement of adhesive strength under shear, a commercial tester, for example an automatic adhesion tester Microtester BT-22 mfd. by Dage Ltd., can be used.

(2) A thermoresistance adhesive set forth in (1) wherein the sealer comprises an epoxy resin or a phenol resin.

(3) A thermoresistance adhesive set forth in (1) or (2) wherein the molding temperature of the sealer is 120 to 200° C.

(4) A thermoresistance adhesive set forth in any one of (1) to (3) wherein the adhesive has a glass transition temperature lower than the temperature at which a semiconductor chip and a lead frame are bonded after heat drying.

(5) A thermoresistance adhesive set forth in any one of (1) to (4) wherein the adhesive contains a heat-resistant resin having amide, imide, ester or ether linkage.

(6) A thermoresistance adhesive set forth in any one of (1) to (5) wherein the adhesive is a heat-resistant resin composition obtained by blending 70 to 99.9 parts by weight of a heat-resistant resin having a hydroxyl, amino or carboxyl group in the molecule and 0.1 to 30 parts by weight of a crosslinking agent having functional groups chemically bondable to the hydroxyl, amino or carboxyl group so that the total amount of the two will become 100 parts by weight.

(7) A thermoresistance adhesive set forth in (5) or (6) wherein the heat-resistant resin is a polyimide resin, a polyamide-imide resin or a precursor thereof.

(8) A thermoresistance adhesive set forth in (6) wherein the heat-resistant resin is a polyimide resin or a precursor thereof obtained by reacting an aromatic tetracarboxylic acid dianhydride with an aromatic diamine compound having a diaminohydroxyl compound as an essential component.

(9) A thermoresistance adhesive solution containing an organic solvent in addition to the components of the thermoresistance adhesive set forth in any one of (4) to (8).

(10) A thermoresistance adhesive solution set forth in (9) containing fine inorganic or organic particles in an amount ratio of 1 to 70 parts by weight to 30 to 99 parts by weight of the heat-resistant resin so that the total amount thereof will become 100 parts by weight.

(11) A thermoresistance adhesive solution set forth in (10) wherein the fine organic particles are the fine particles of a heat-resistant resin having amide, imide, ester or ether linkage, the average size (diameter) of said particles being 20 μm or less.

(12) A thermoresistance adhesive solution set forth in (10) or (11) wherein before heat drying, the fine organic particles exist as a heterogeneous phase as opposed to the homogeneous phase consisting of the heat-resistance resin and the organic solvent, and after heat drying, there is formed a homogeneous phase containing the heat-resistant resin and the fine organic particles as essential components.

(13) A thermoresistance adhesive solution set forth in any one of (9) to (12) wherein the organic solvent is a lactone or a carbonate.

(14) A thermoresistance adhesive solution set forth in any one of (9) to (13) having a viscosity of 100 to 400 Pa·s and a thixotropy factor of 2.0 to 5.0.

(15) A thermoresistance resin paste comprising (A) a heat-resistant resin having a hydroxyl, amino or carboxyl group in the molecule, (B) fine organic particles, (C) a crosslinking agent having functional groups chemically bondable to said hydroxyl, amino or carboxyl group, and (D) a solvent, said materials being blended so that before heat drying, the fine organic particles (B) exist as a heterogeneous phase as opposed to the homogeneous phase consisting of the heat-resistant resin (A), crosslinking agent (C) and solvent (D), and after heat drying, there is formed a homogeneous phase containing the fine organic particles (B) and crosslinking agent (C) as essential components.

(16) A thermoresistance resin paste set forth in (15) wherein the heat-resistant resin (A) is a resin whose temperature of 1% weight loss on heating is 350° C. or above.

(17) A thermoresistance resin paste set forth in (15) wherein the heat-resistant resin (A) is a polyimide resin having a hydroxyl or carboxyl group in the molecule.

(18) A thermoresistance resin paste set forth in (17) wherein the polyimide resin having a hydroxyl group in the molecule is the one obtained by reacting an aromatic tetracarboxylic acid dianhydride with an aromatic diamine containing a diaminohydroxyl compound as an essential component.

(19) A thermoresistance resin paste set forth in (18) wherein the diaminohydroxyl compound is 2,2-bis(4-hydroxy-3-aminophenyl)propane, 2,2-bis(4-hydroxy-3-aminophenyl)hexafluoropropane or 3,3'-dihydroxy-4,4'-diaminobiphenyl.

(20) A thermoresistance resin paste set forth in (15) wherein the fine organic particles (B) are the fine particles of a heat-resistant resin whose temperature of 1% weight loss on heating is 350° C. or above, the average size (diameter) of the said particles being 20 μm or less.

(21) A thermoresistance resin paste set forth in (20) wherein the heat-resistant resin particles are the polyimide resin particles.

(22) A thermoresistance resin paste set forth in (15) wherein the crosslinking agent (C) is a coupling agent.

(23) A thermoresistance resin paste set forth in (22) wherein the coupling agent is a silane coupling agent.

(24) A thermoresistance resin paste set forth in (15) wherein the solvent (D) is a lactone, an ether or a carbonate.

(25) A thermoresistance resin paste set forth in (15) comprising (A) a heat-resistant resin having a hydroxyl, amino or carboxyl group in the molecule, (B) fine organic particles, and (C) a crosslinking agent having functional groups chemically bondable to said hydroxyl, amino or carboxyl group, wherein the amount of (B) is 10 to 300 parts by weight and the amount of (C) is 1 to 30 parts by weight, per 100 parts by weight of (A).

(26) A thermoresistance resin paste set forth in (15) having a thixotropy factor of 1.5 or greater and a viscosity of 10 to 500 Pa·s.

(27) A thermoresistance adhesive obtained by drying the thermoresistance adhesive solution set forth in any one of (9) to (14) or the thermoresistance resin paste set forth in any one of (15) to (26).

(28) A semiconductor chip having a thermoresistance adhesive layer produced by providing a layer of the thermoresistance adhesive set forth in any one of (1) to (8) and (27) on the circuit forming side of a semiconductor chip.

(29) A lead frame having a thermoresistance adhesive layer produced by providing a layer of the thermoresistance adhesive set forth in any one of (1) to (8) and (27) on the semiconductor-mounted side of a lead frame.

(30) A film having a thermoresistance adhesive layer produced by providing a layer of the thermoresistance adhesive set forth in any one of (1) to (8) and (27) on one or both sides of a support film.

(31) A semiconductor device in which the plural inner leads of a lead frame are bonded to the circuit-formed side of a semiconductor chip by the thermoresistance adhesive set forth in any one of (1) to (8) and (27), and the semiconductor chip and the inner leads of the lead frame are electrically connected by wire bonding, said semiconductor chip being sealed by a sealer.

(32) A semiconductor in which the plural inner leads of a lead frame are bonded to the circuit forming side of a semiconductor chip having a layer of said thermoresistance adhesive with interposition of a layer of the thermoresistance adhesive set forth in any one of (1) to (8) and (27), and the semiconductor chip and the inner leads of the lead frame are electrically connected by wire bonding, said semiconductor chip being sealed by a sealer.

(33) A semiconductor device in which the plural inner leads of said lead frame having a thermoresistance adhesive layer are bonded to the circuit forming side of a semiconductor chip through a layer of the thermoresistance adhesive set forth in any one of (1) to (8) and (27), and the semiconductor chip and the inner leads of the lead frame are electrically connected by wire bonding, said semiconductor chip being sealed by a sealer.

(34) A semiconductor device in which the plural inner leads of a lead frame are bonded to the circuit forming side of a semiconductor chip with the inter-position of a film having a layer of the thermoresistance adhesive set forth in any one of (1) to (8) and (27), and the semiconductor chip and the inner leads of the lead frame are electrically connected by wire bonding, said semiconductor chip being sealed by a sealer.

(35) A process for producing a thermoresistance resin paste which comprises mixing (I) a heat-resistant resin A soluble in the solvent of (III) at room temperature and at the heat drying temperature, (II) a heat-resistant resin B insoluble in the solvent of (III) at room temperature but soluble at the heat drying temperature, and (III) a solvent, dissolving the said materials by heating, and cooling the resulting solution to have the fine particles of the heat-resistant resin B of (II) deposited and dispersed in the solution of the heat-resistant resin A of (I) and the solvent of (III).

(36) The process for producing a thermoresistance resin paste set forth in (35) wherein the heat-resistant resin A of (I) and the heat-resistant resin B of (II) are an aromatic polyimide resin obtained by reacting an aromatic tetra-carboxylic acid dianhydride and an aromatic diamine.

(37) The process for producing a thermoresistance resin paste set forth in (36) wherein the heat-resistant B of (II) is an aromatic polyimide resin obtained by reacting an aromatic tetracarboxylic acid dianhydride containing 50 mol % or more of bis(3,4-dicarboxyphenyl)-ether dianhydride with an aromatic diamine containing 50 mol % or more of 2,2-bis[4-(4-aminophenoxy)phenyl]propane, and the solvent of (III) is γ-butyrolactone.

(38) The process for producing a thermoresistance resin paste set forth in (36) wherein the fine particles of the heat-resistant resin B of (II) are deposited and dispersed in a solution of the heat-resistant resin A of (I) and the solvent of (III) so that the maximal size of the particles will become 10 µm or less.

(39) The process for producing a thermoresistance resin paste set forth in (36) wherein the fine particles of the heat-resistant resin B of (II) are deposited and dispersed in a solution of the heat-resistant resin A of (I) and the solvent of (III) so that the paste will have a thixotropy factor of 1.5 or greater.

The thermoresistance adhesive according to the present invention is the one which does not dissolve in the sealer-composing resins at the sealer molding temperature and whose semiconductor chip/lead frame adhesive strength under shear is 1 N/4 mm$^2$ or greater. Such a thermoresistance adhesive contains a heat-resistant resin. The term "heat-resistant" (resin) used here signifies that the resin has such a degree of heat resistance that it won't dissolve at the sealer molding temperature, preferably such a degree of heat resistance that it won't dissolve at the heating temperature used for wire bonding. Examples of such heat-resistant resins include those having amide linkage, imide linkage, ester linkage or ether linkage, specifically polyimide resins, polyamide-imide resins, polyamide resins, polyester resins and polyether resins. Regarding the polyimide and polyamide resins, it is possible to use polyamide acid, which is the precursor of such resins, and its partially imidized resins. The thermoresistance adhesive containing such a heat-resistant resin may be either thermoplastic or thermosetting and is not restricted in type as far as it does not dissolve in the sealer-composing resins at the sealer molding temperature and is capable of heat bonding a semiconductor chip and a lead frame, with its semiconductor chip/lead frame adhesive strength under shear being 1 N/4 mm$^2$ or greater.

Polyimide resins can be obtained by reacting aromatic tetracarboxylic acid dianhydrides with aromatic diamine compounds.

Examples of the aromatic tetracarboxylic acid dianhydrides usable for the said purpose include pyromellitic acid dianhydride, 3,3',4,4'-biphenyl-tetracarboxylic acid dianhydride, 2,2',3,3'-biphenyltetracarboxylic acid dianhydride, 2,3,3',4'-biphenyltetracarboxylic acid dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perillenetetracarboxylic acid dianhydride, bis(3,4-dicarboxyphenyl)ether dianhydride, benzene-1,2,3,4-tetracarboxylic acid dianhydride, 3,4,3',4'-benzophenonetetracarboxylic acid dianhydride, 2,3,2',3'-benzophenonetetracarboxylic acid dianhydride, 2,3,2',3'-benzophenonetetracarboxylic acid dianhydride, 2,3,3',4'-benzophenonetetracarboxylic acid dianhydride, 1,2,5,6-naphthalenetetracarboxylic acid dianhydride, 2,3,6,7-naphthalenetetracarboxylic acid dianhydride, 1,2,4,5-naphthalenetetracarboxylic acid dianhydride, 1,4,5,8-naphthalenetetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, phenanthrene-1,8,9,10-tetracarboxylic acid dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl) benzene dianhydride, 1,3-bis(3,4-dicarboxyphenyl)-1,1,3,3-tetramethyldicyclohexane dianhydride, p-phenylenebis (trimellitic acid monoester dianhydride), 2,2-bis(3,4-dicarboxyphenyl)hexafluoropropane dianhydride, 2,2-bis[4-(3,4-dicarboxyphenoxy)phenyl]hexafluoropropane dianhydride, 2,2-bis[4-(3,4-dicarboxyphenoxy)phenyl] propane dianhydride, 4,4-bis(3,4-dicarboxyphenoxy) diphenyl sulfide dianhydride, 1,4-bis(2-hydroxyhexafluoroisopropyl)benzenebis(trimellitate anhydride), 1,3-bis(2-hydroxyhexafluoroisopropyl) benzenebis(trimellitate anhydride), 1,2-(ethylene)bis (trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride), and 1,18-(octadecamethylene)bis(trimellitate anhydride). These compounds may be used singly or as a mixture of two or more.

For the said aromatic tetracarboxylic acid dianhydrides, it is possible to use where necessary the tetracarboxylic acid dianhydrides other than the said aromatic tetracarboxylic acid dianhydrides within limits not exceeding 50 mol % of the aromatic tetracarboxylic acid dianhydride. Examples of such tetracarboxylic acid dianhydrides include ethylenetetracarboxylic acid dianhydride, 1,2,3,4-butanetetracarboxylic acid dianhydride, pyrazine-2,3,5,6-tetracarboxylic acid dianhydride, thiophene-2,3,4,5-tetracarboxylic acid dianhydride, decahydronaphthalene-1,4,5,8-tetracarboxylic acid dianhydride, 4,8-dimethyl-1,2,3,5,6,7-hexahydronaphthalene-1,2,5,6-tetracarboxylic acid dianhydride, cyclopentane-1,2,3,4-tetracarboxylic acid dianhydride, pyrrolidine-2,3,4,5-tetracarboxylic acid dianhydride, 1,2,3,4-cyclobutanetetracarboxylic acid dianhydride, bis(exo-bicyclo[2,2,1]heptane-2,3-dicarboxylic acid anhydride)sulfone, bicyclo-(2,2,2)-octo (7)-ene-2,3,5,6-tetracarboxylic acid dianhydride, 5-(2,5-dioxotetrahydrofuryl)-3-methyl-3-cyclohexene-1,2-dicarboxylic acid anhydride, and tetrahydrofuran-2,3,4,5-tetracarboxylic acid dianhydride.

Examples of the aromatic diamine compounds include o-phenylenediamine, m-phenylenediamine, p-phenylenediamine, 3,3'-diaminodiphenyl ether, 4,4'-diaminodiphenyl ether, 3,4'-diaminodiphenyl ether, 3,3'-diaminodiphenylmethane, 3,4'-diaminodiphenylmethane, 4,4'-diaminodiphenylmethane, 3,3'-diaminodiphenyldifluoromethane, 4,4'-diaminodiphenyldifluoromethane, 3,3'-diaminodiphenylsulfone, 3,4'-diaminodiphenylsulfone, 4,4'-diaminodiphenylsulfone, 3,3'-diaminodiphenyl sulfide, 3,4'-diaminodiphenyl sulfide, 4,4'-diaminodiphenyl sulfide, 3,3'-diaminodiphenyl ketone, 3,4'-diaminodiphenyl ketone, 4,4'-diaminodiphenyl ketone, 2,2-bis(3-aminophenyl)propane, 2,2-(3,4'-diaminodiphenyl)propane, 2,2-bis(4-aminophenyl) propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy) benzene, 1,4-bis(4-aminophenoxy)benzene, 3,3'-[1,4-phenylenebis(1-methylethylidene)]bisaniline, 3,4'-[1,4-phenylenebis(1-methylethylidene)]bisaniline, 4,4'-[1,4-phenylenebis(2-methylethylidene)]bisaniline, 2,2-bis[4-(3-aminophenoxy)phenyl]propane, 2,2-bis[4-(4-aminophenoxy)phenyl]propane, 2,2-bis[4-(3-aminophenoxy)phenyl]hexafluoropropane, 2,2-bis[4-(4-aminophenoxy)phenyl]hexafluoropropane, bis[4-(3-aminophenoxy)phenyl]sulfide, bis[4-(4-aminophenoxy) phenyl]sulfide, bis[4-(3-aminophenoxy)phenyl]sulfone, and bis4-(4-aminophenoxy)phenyl]sulfone. These compounds may be used either singly or as a mixture of two or more.

For these aromatic diamine compounds, it is possible to use where necessary the diamine compounds other than the said aromatic diamine compounds within limits not exceeding 50 mol % of the aromatic diamine compound. Examples of such diamine compounds include 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,3-bis(3-aminopropyl)tetramethyldisiloxane, and 1,3-bis(3-aminopropyl)tetramethylpolysiloxane.

In the present invention, it is preferable in view of film properties to react equimolar amounts of an aromatic tetracarboxylic acid dianhydride and an aromatic diamine compound.

Reaction of an aromatic tetracarboxylic acid dianhydride and an aromatic diamine compound is carried out in an organic solvent. The organic solvents usable for the reaction include nitrogeneous compounds such as N-methylpyrrolidone, dimethylacetamide, dimethylformamide, 1,3-dimethyl-3,4,5,6-tetrahydro-2(1H)-pyrimidinone, and 1,3-dimethyl-2-imidazoridinone; sulfur compounds such as sulforan and dimethyl sulfoxide; lactones such as γ-butyrolactone, γ-valerolactone, γ-caprolactone, γ-heptalactone, α-acetyl-γ-butyrolactone and ε-caprolactone; ethers such as dioxane, 1,2-dimethoxyethane, diethylene glycol dimethyl (or diethyl, dipropyl or dibutyl) ether, triethylene glycol (or diethyl, dipropyl or dibutyl) ether, and tetraethylene glycol dimethyl (or diethyl, dipropyl or dibutyl) ether; ketones such as methyl ethyl ketone, methyl isobutyl ketone, cyclohexanone and acetophenone; alcohols such as butanol, octyl alcohol, ethylene glycol; glycerin, diethylene glycol monomethyl (or monoethyl) ether, triethylene glycol monomethyl (or monoethyl) ether, and tetraethylene glycol monomethyl (or monoethyl) ether; phenols such as phenol, cresol and xylenol; esters such as ethyl acetate, butyl acetate, ethyl cellosolve acetate and butyl cellosolve acetate; hydrocarbons such as toluene, xylene, diethylbenzene and cyclohexane; and halogenated hydrocarbons such as trichloroethane, tetrachloroethane and monochlorobenzene. These solvents may be used either singly or as a mixture of two or more. Lactones, ethers and ketones are preferred in view of solubility, hygroscopicity, low-temperature setting and environmental safety.

The reaction is carried out at 80° C., preferably at 0 to 50° C. As the reaction proceeds, the reaction solution is gradually thickened, and polyamide acid, which is the precursor of polyimide resin, is formed. This polyamide acid may be partially imidized. The partially imidized version is also included in the category of polyimide resin precursor in the present invention.

Polyimide resin can be obtained from dehydration ring closure of the said reaction product (polyamide acid). Dehydration ring closure can be effected by such method as heat treatment at 120–250° C. (thermal imidization) or using a dehydrating agent (chemical imidization). In the case of the heat treatment at 120–250° C., it is preferably carried out while removing water generated by the dehydration reaction out of the system. In this case, water may be removed as an azeotrope with a solvent such as benzene, toluene or xylene.

In case dehydration ring closure is effected by using a dehydrating agent, it is preferable to use an acid anhydride such as acetic anhydride, propionic anhydride or benzoic anhydride, a carbodiimide compound such as dicyclohexylcarbodiimide, or the like as dehydrating agent. In this case, if necessary, a dehydration catalyst such as pyridine, isoquinoline, trimethylamine, aminopyridine or imidazole may be used. The dehydrating agent or dehydration catalyst is preferably used in an amount of 1 to 8 moles per mole of the aromatic tetracarboxylic acid dianhydride.

The polyamide-imide resin or its precursor used in the present invention can be produced by using a trivalent tricarboxylic acid anhydride or a derivative thereof such as trimellitic acid anhydride or its derivative (such as chloride of trimellitic acid anhydride) in place of the aromatic tetracarboxylic acid dianhydride in the production of the said polyimide or its precursor. It is also possible to produce the said polyimide resin or its precursor by using, in place of the aromatic diamine compound or other diamine compound, a diisocyanate compound in which the residues other than amino group correspond to the said diamine compound. The diisocyanate compounds usable here include those obtained by reacting the said aromatic diamine compounds or other diamine compounds with phosgene or thionyl chloride.

The polyamide resin used in the present invention can be produced by reacting an aromatic dicarboxylic acid such as terephthalic acid, isophthalic acid and phthalic acid, or a derivative thereof such as dichloride or anhydride of said acids, with an aromatic diamine compound or other diamine compound such as mentioned above.

The polyester resins usable in the present invention include those obtainable by reacting the said aromatic dicarboxylic acids such as terephthalic acid, isophthalic acid and phthalic acid, or their derivatives such as dichlorides and acid anhydrides, with an aromatic diol compound such as 1,4-dihydroxybenzene, bisphenol F, bisphenol A or 4,4'-dihydroxybiphenyl.

The polyamide-imide resin used in the present invention is preferably the one obtained by reacting an aromatic tetracarboxylic acid dianhydride with an aromatic diamine compound containing isophthalic acid dihydrazide as essential component. As the aromatic tetracarboxylic acid dianhydride and aromatic diamine amound, those mentioned above can be used. The molar ratio of isophthalic acid dihydrazide in the aromatic diamine compound is preferably adjusted to be 1 to 100%. If the molar ratio is less than 1%, resistance to dissolution in the sealer-composing resins tends to reduce, while a high content of isophthalic acid dihydrazide tends to lower moisture vapor resistance of the adhesive layer. The preferred molar ratio of isophthalic acid dihydrazide is therefore 10 to 80%, more preferably 20 to 70%. This polyamide-imide resin can be synthesized by using the same aromatic tetracarboxylic acid dianhydride/ aromatic diamine compound ratio, the same organic solvent and the same synthetic process as employed for the synthesis of the said polyimide resin.

The thermoresistance adhesive according to the present invention may be used in the form a solution by dissolving the adhesive in an organic solvent, and this adhesive solution may be applied to one or both of the adherends, such as a semiconductor chip and a lead frame, so as to form an adhesive layer in advance. Also, the adhesive may be initially worked into a film product such as adhesive tape, adhesive film or adhesive sheet and used as such product. Such adhesive tape, adhesive film or adhesive sheet can be obtained, for example, by applying or casting the thermoresistance adhesive solution on a substrate such as a glass plate or a stainless plate and, after drying, separating the coating to obtain an adhesive tape, adhesive film or adhesive sheet made of the said adhesive alone, or by applying the thermoresistance adhesive solution on both sides of a substrate such as a plastic film and drying to form an adhesive layer thereon to obtain an adhesive tape, adhesive film or adhesive sheet. Also, the thermoresistance adhesive solution may be impregnated in a thin fabric mat made of fiber with high heat resistance such as glass fiber and dried to make a fiber-reinforced adhesive sheet.

Especially when applying the thermoresistance adhesive solution to such adherends as semiconductor chip and lead frame, it is preferable to afford appropriate thixotropic properties to the solution. This proves to be advantageous for screen printing in particular.

The thermoresistance adhesive solutions to which appropriate thixotropic properties have been afforded, namely the thixotropic thermoresistance adhesives include the thermoresistance resin pastes prepared by containing the fine inorganic or organic particles in the said thermoresistance adhesive solutions. Incorporation of the inorganic or organic particles makes it possible to afford the thixotropic properties required for screen printing. Such inorganic or organic particles are preferably blended in an amount of 1 to 70 parts by weight to 30 to 99 parts by weight of the heat-resistant resin so that the total amount of the two materials will become 100 parts by weight. When the amount of the inorganic or organic particles blended is less than 1 part by weight, it may not be possible to provide the thixotropic properties required for screen printing, making it difficult to obtain the desired resolving potency. Presence of the inorganic or organic particles in excess of 70 parts by weight tends to deteriorate transfer performance and processability in screen printing. More preferably, the said inorganic or organic particles are used in an amount of 50 to 5 parts by weight to 50 to 95 parts by weight of the heat-resistant resin so that the total of the two materials will become 100 parts by weight.

The inorganic particles usable in the present invention include the insulating inorganic fine particles of such materials as silica, alumina, titania, tantalum oxide, zirconia, silicon nitride, barium titanate, barium carbonate, lead titanate, lead titanozirconate, lanthanum lead titanozirconate, gallium oxide, spinnel, mullite, cordierite, talc, aluminum titanate, yttria-containing zirconia, barium sulfate, and barium silicate.

The heat-resistant resin constituting the main component of the thermoresistance resin paste is the one which is soluble in the organic solvent used for forming the thermoresistance adhesive solution, whereas the organic particles used in this invention are those which are insoluble in the said organic solvent before heat drying.

As the organic particles, it is preferable to use the fine particles of a heat-resistant resin having amide, imide, ester or ether linkage. Preferred examples of such heat-resistant resins are polyimide resins and their precursors, polyamide-imide resins and their precursors, and polyamide resins, in view of heat resistance and mechanical properties.

The said polyimide resins and their precursors, polyamide-imide resins and their precursors, and polyamide resins, can be selected from those exemplified above.

These fine particles of heat-resistant resins are selected from those which are insoluble in the organic solvent in the thermoresistance adhesive solution before heat drying.

As means for forming the fine particles, it is possible to employ various methods which include, for example, non-aqueous dispersion polymerization method (JP-B 60-48531 and JP-A 59-230018), precipitation polymerization method (JP-A 59-108030), method in which the powder recovered from the resin solution is mechanically ground, method in which the resin solution is added to a poor solvent and worked into fine particles under high shearing force, method in which the atomized resin solution is dried to form the fine particles, and method in which a resin having temperature dependency of solubility in the solvent or the solvent in the resin solution is formed into fine particles by precipitation means.

The thermal decomposition temperature of the fine organic particles is preferably not lower than 250° C., and it is especially preferable to use the heat-resistant resin particles whose thermal decomposition temperature is not lower than 350° C.

Two or more types of inorganic and organic particles may be used as required. It is also possible to use a mixture of inorganic and organic particles.

Both inorganic and organic particles are preferably of an average size of 40 $\mu$m or less. It is more preferable to use the fine particles of a heat-resistant resin having amide, imide, ester or ether linkage with an average particle size of 20 $\mu$m or less, preferably 0.1 to 10 $\mu$m, which can minimize the damage to the semiconductor chip when applying the thixotropic thermoresistance adhesive or thermoresistance resin paste to screen printing, and which can also reduce the ionic contaminant concentration.

As the thermoresistance resin paste, it is preferable to use the one prepared by blending the particles in such a manner that the organic particles will exist as a heterogeneous phase as opposed to the homogeneous layer containing a heat-resistant resin and an organic solvent before heat drying, while a homogeneous phase containing the heat-resistant resin and organic solvent as essential components will be formed after heat drying. As mentioned above, the heat-resistant resin constituting the main component of the thermoresistance resin paste is the one which is soluble in the organic solvent used for the thermoresistance adhesive solution, while the organic particles are those which are insoluble in said organic solvent before heat drying, but it is desirable that both of them have the nature that they dissolve in said organic solvent at the temperature used for heat drying. "Heat drying" referred to in this invention means drying conducted when forming an adhesive layer on the adherend, and drying performed in making of said adhesive tape, adhesive film or adhesive sheet by heating at 50 to 350° C. In some cases, the thermoresistance resin paste may be applied to the adherend to effect adhesion simultaneously with drying.

In order that a homogeneous phase containing the heat-resistant resin and fine organic particles as essential components may be formed after heat drying, it is desirable that the heat-resistant resin and organic particles used are compatible with each other. Specifically, it is preferable to use a combination of heat-resistant resin and organic particles in which the difference in solubility parameter between the heat-resistant resin and the organic particles is 2.0 or less, more preferably 1.5 or less. The "solubility parameter" referred to herein is the value (unit: (MJ/m3)1/2) determined according to the Fedors method described in Polym. Eng. Sci., Vol. 14, pp. 147–154. The heat-resistant resin compositions using such fine organic particles are disclosed in, for instance, JP-A 2-289646, JP-A 4-248871 and JP-A 4-85379, and these compositions can be used in the present invention. Said heat-resistant resins can be used as the organic particles, but as mentioned before, these organic particles must be of the type which, before heat drying, is insoluble in the organic solvent used for forming a thermoresistance adhesive solution. The thermoresistance resin paste using such organic particles, as compared with a thermoresistance resin paste using the inorganic and organic particles insoluble in the organic solvent both at room temperature and at heat drying temperature, is capable of forming a uniform and thick film free of such defects as pinholes or voids, and also makes it possible to form a dry film with excellent mechanical strength and humidity resistance. The thermoresistance adhesive of the above formulation—in which the organic particles exist as a heterogeneous phase as opposed to the homogeneous phase containing a heat resistant resin and organic particles before heat drying, and a homogeneous phase containing a heat-resistant resin or organic particles and a crosslinking agent as essential components is formed after heat drying—is particularly preferred in terms of adhesion of a chip and a lead frame, adhesiveness to the sealer, and resistance to package cracking in solder reflowing. The crosslinking agent is preferably of the type which forms a homogeneous phase with the heat-resistant resin and solvent before heat drying. The crosslinking agent may be reacted with the heat-resistant resin before heat drying, but preferably it is reacted with the heat-resistant resin in the course of heat drying.

Any of the said homogeneous phases may contain the organic solvent which remains after heat drying.

As the organic solvent for the thermoresistance adhesive solution or thermoresistance resin paste according to this invention, it is possible to use, for instance, the solvents described in Solvent Handbook, Kodansha, 1976, pp. 143–852. Examples of such solvents include nitrogenous compounds such as N-methylpyrrolidone, dimethylacetamide, dimethylformamide, 1,3-dimethyl-3,4, 5,6-tetrahydro-2(1H)-pyrimidinone, and 1,3-dimethyl-2-imidazolidinone; sulfur compounds such as sulforan and dimethyl sulfoxide; lactones such as γ-butyrolactone, γ-valerolactone, γ-caprolactone, γ-heptalactone, α-acetyl-, γ-butyrolactone and ε-caprolactone; ethers such as dioxane, 1,2-dimethoxyethane, diethylene glycol dimethyl (or diethyl, dipropyl or dibutyl) ether, triethylene glycol dimethyl (or diethyl, dipropyl or dibutyl) ether, and tetraethylene glycol dimethyl (or diethyl, dipropyl or dibutyl) ether; ketones such as methyl ethyl ketone, methyl isobutyl ketone, cyclohexanone and acetophenone; alcohols such as butanol, octyl alcohol, ethylene glycol, glycerin, diethylene glycol monomethyl (or monoethyl) ether, triethylene glycol monomethyl (or monoethyl) ether, and tetraethylene glycol monomethyl(or monoethyl) ether; phenols such as phenol, cresol and xylenol; esters such as ethyl acetate, butyl acetate, ethyl cellosolve acetate and butyl cellosolve acetate; hydrocarbons such as toluene, xylene, diethylbenzene and cyclohexane; halogenated hydrocarbons such as trichloroethane, tetrachloroethane and monochlorobenzene; and carbonates such as ethylene carbonate and propylene carbonate.

The boiling point of the solvent should be 100° C. or higher, preferably 150 to 300° C., in view of the available period of the paste for screen printing. Also, considering hygroscopic stability and volatility of the paste, it is preferable to use non-nitrogenous solvents, for example, lactones such as γ-butyrolactone, γ-valerolactone, γ-caprolactone, γ-heptalactone, α-acetyl-γ-butyrolactone and ε-caprolactone, and carbonates such as ethylene carbonate and propylene carbonate.

For dispersing the inorganic or organic particles in the heat-resistant resin, the methods commonly used in coating industry, such as roll milling and ball milling, can be employed; any method can be used as far as it is capable of effecting desired dispersion. A dispersion method which requires no mixing operation for directly precipitating and making finer the organic particles in the heat-resistant resin solution is especially preferred as this method can reduce the ionic contaminant concentration in the dispersion step and also allows a significant cost reduction.

As the heat-resistant resin, it is possible to use the resins having functional groups such as hydroxyl group, amino group and carboxyl group. These groups may exist at the terminal of the resin molecule in the heat-resistant resin, but it is preferable to use a resin in which the said groups exist in the molecule, not at the terminal. In case the resin has functional groups such as mentioned above, it is preferable to use a crosslinking agent having functional groups which are reactive with the above-said functional groups.

As the thermoresistance resin paste, it is preferable to use the one specified below: a thermoresistance resin paste comprising (A) a heat-resistant resin having functional groups such as hydroxyl group, amino group or carboxyl group in the molecule, (B) fine organic particles, (C) a crosslinking agent having functional groups which are chemically bondable to the said functional groups such as hydroxyl group, amino group or carboxyl group, and (D) a solvent, these materials being blended in such a manner that the organic particles will exist as a heterogeneous phase as opposed to the homogeneous phase containing the heat-resistant resin (A), crosslinking agent.(C) and solvent (D) before heat drying, and a homogeneous phase containing the heat-resistant resin (A), organic particles (B) and crosslinking agent (C) as essential components will be formed after heat drying.

As the crosslinking agent, the compounds having one or more of epoxy group, hydroxyl group, amino group, carboxyl group, methylol group, maleimide group, oxazoline group, vinyl group, methacryloyl group, methoxysilane group and ethoxysilane group, at least two of any group, in the molecule can be used. The ratio of the heat-resistant resin to the crosslinking agent in the composition is preferably 70–99.9 to 0.1–30 (in parts by weight) with the total of the two being 100 parts by weight. When the ratio of the crosslinking agent is less than 1 part by weight, the degree of crosslinking of the heat-resistant resin is insufficient, making the said resin liable to dissolve in the sealer composing resins at the sealer molding temperature and increasing the risk of package cracking in solder reflowing. On the other hand, when the ratio of the crosslinking agent exceeds 30 parts by weight, the degree of crosslinking of the heat-resistant resin becomes excessive to reduce heat bonding force to the semiconductor chip or lead frame, resulting in a decreased adhesive strength under shear. It is thus preferable to use a crosslinking agent which can provide a moderate degree of crosslinking. The type of the crosslinking agent to be used in the present invention is not specified, but the coupling agents are preferred. The crosslinking agent is preferably blended in a ratio of crosslinking agent to heat-resistant resin of 0.5–25 to 75–99.5 (in parts by weight) with the total of the two being 100 parts by weight.

As the heat-resistant resin having said functional groups, it is preferred to use the resins having hydroxyl, amino or carboxyl group, and as the crosslinking agent, those having the functional groups chemically bondable to the hydroxyl, amino or carboxyl group are preferably used. As the crosslinking agent having the functional groups chemically bondable to the hydroxyl, amino or carboxyl group, it is preferable to use the one having two or more functional groups in the molecule, at least one of such functional groups being reacted with the said heat-resistant resin having hydroxyl, amino or hydroxyl group while the other functional group(s) is reacted with the heat-resistant resin having hydroxyl or carboxyl group in the molecule or reacted with each other. The crosslinking agent used in the present invention is not subject to any specific restrictions regarding molecular structure, molecular weight, etc., as far as it has at least two functional groups. Typical examples of the functional groups which react with hydroxyl group are epoxy group, isocyanate group and methylol group. Examples of the functional groups which react with carboxyl group are epoxy group, amino group, vinyl group and oxazoline group. Examples of the functional groups which react with each other are methoxysilane group and ethoxysilane group. The silane coupling agents which can afford a moderately crosslinked structure to the dried product of the thermoresistance resin paste and can also provide storage stability to the paste are preferably used as crosslinking agent. Such coupling agents include, for example, silane coupling agents, titanate-based coupling agents and aluminum-based coupling agents. The silane coupling agents are the most preferred.

The heat-resistant resin having hydroxyl group in the molecule can be produced by using a diaminohydroxyl compound having hydroxyl group as a part of the diamine moiety in the synthesis of said polyimide resins and their precursor, polyamide-imide resins and their precursor, and polyamide resins.

Examples of the diaminohydroxyl compounds usable in the present invention include the following: 1,2-diamino-4-hydroxybenzene, 1,3-diamino-5-9hydroxybenzene, 1,3-diamino-4-hydroxybenzene, 1,4-diamino-6-hydroxybenzene, 1,5-diamino-6-hydroxybenzene, 1,3-diamino-4,6-dihydroxybenzene, 1,2-diamino-3,5-dihydroxybenzene, 4-(3,5-diaminophenoxy)phenyl, 3-(3,5-diaminophenoxy)phenol, 2-(3,5-diaminophenoxy)phenol, 3,3'-dihydroxy-4,4'-diaminobiphenyl, 3,3'-diamino-4,4'-dihydroxybiphenyl, 2,2-bis(4-hydroxy-3-aminophenyl)propane, 2,2-bis(4-hydroxy-3-aminophenyl)hexafluoropropane, bis(4-hydroxy-3-aminophenyl) ketone, 2,2-bis(4-hydroxy-3-aminophenyl)sulfide, 2,2-bis(4-hydroxy-3-aminophenyl)ether, 2,2-bis(4-hydroxy-3-aminophenyl)sulfone, 2,2-bis(4-hydroxy-3-aminophenyl)methane, 4-[(2,4-diamino-5-pyrimidinyl)methyl]phenol, p-(3,6-diamino-s-triazine-2-yl)phenol, 2,2-bis(4-hydroxy-3-aminophenyl)difluoromethane, 2,2-bis(4-amino-3-hydroxyphenyl)propane, 2,2-bis(4-amino-3-hydroxyphenyl)hexafluoropropane, bis(4-amino-3-hydroxyphenyl)ketone, 2,2-bis(4-amino-3-hydroxyphenyl)sulfide, 2,2-bis(4-amino-3-hydroxyphenyl)ether, 2,2-bis(4-amino-3-hydroxyphenyl)sulfone, 2,2-bis(4-amino-3-hydroxyphenyl)methane, 2,2-bis(4-amino-3-hydroxyphenyl)difluoromethane, and the compounds represented by the following formulae:

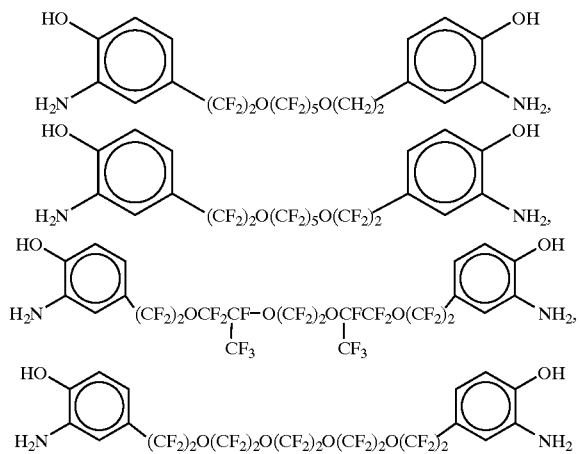

Of these compounds, 2,2-bis(4-hydroxy-3-aminophenyl)propane, 2,2-bis(4-hydroxy-3-aminophenyl)hexafluoropropane and 3,3'-dihydroxy-4,4'-diaminobiphenyl are preferred as they are active in elevating solubility and hydroxyl group concentration and economically advantageous.

The molar ratio of the diaminohydroxyl compound in the aromatic diamine compound is preferably adjusted to be 1 to 100 mol %. When its ratio is less than 1 mol %, compound resistance to dissolving in the sealer composing resins tends to lower, while a too high content of the diaminohydroxyl compound tends to increase moisture absorption of the dry film. Thus, the preferred ratio of the diaminohydroxl compound is 5 to 80 mol %, more preferably 10 to 50 mol %.

The heat-resistant resin having carboxyl group in the molecule can be produced by using a diamine compound having carboxyl group as a part of the diamine moiety in the synthesis of said polyimide resins or their precursor, polyamide-imide resins or their precursor, and polyamide resins.

It is preferable to use the diamine compounds having at least one carboxyl group in the molecule. Examples of such diamine compounds include 1,2-diamino-4-carboxybenzene, 1,3-diamino-5-carboxybenzene, 1,3-diamino-4-carboxybenzene, 1,4-diamino-6-carboxybenzene, 1,5-diamino-6-carboxybenzene, 1,3-diamino-4,6-dicarboxybenzene, 1,2-diamino-3,5-dicarboxybenzene, 4-(3,5-diaminophenoxy)benzoic acid, 3-(3,5-diaminophenoxy)benzoic acid, 2-(3,5-daminophenoxy) benzoic acid, 3,3'-dicarboxy-4,4'-diaminobiphenyl, 3,3'-dicarboxy-4,4'-dicarboxybiphenyl, 2,2-bis(4-carboxy-3-aminophenyl)propane, 2,2-bis(4-carboxy-3-aminophenyl)hexafluoropropane, bis(4-carboxy-3-aminophenyl) ketone, 2,2-bis(4-carboxy-3-aminophenyl) sulfide, 2,2-bis(4-carboxy-3-aminophenyl)ether, 2,2-bis(4-carboxy-3-aminophenyl)sulfone, 2,2-bis(4-carboxy-3-aminophenyl)methane, 4-[(2,4-diamino-5-pyrimidinyl)methyl]benzoic acid, p-(3,6-diamino-s-triazine-2-yl)benzoic acid, 2,2-bis(4-carboxy-3-aminophenyl)difluoromethane, 2,2-bis(4-amino-3-carboxyphenyl)propane, 2,2-bis(4-amino-3-carboxyphenyl)hexafluoropropane, bis(4-amino-3-carboxyphenyl) ketone, 2,2-bis(4-amino-3-carboxyphenyl) sulfide, 2,2-bis(4-amino-3-carboxyphenyl)ether, 2,2-bis(4-amino-3-carboxyphenyl)sulfone, 2,2-bis(4-amino-3-carboxyphenyl)methane, and 2,2-bis(4-amino-3-carboxyphenyl)difluoromethane. Of these compounds, 1,3-diamino-5-carboxybenzene is preferred because of excellent heat resistance, flexibility and economy. An aromatic tetracarboxylic acid dianhydride and an aromatic diamine compound containing a diamine compound having carboxyl group as essential component are preferably reacted in substantially equimolar quantities for providing the best film properties. The ratio of the diamine compound having carboxyl group in the aromatic diamine compound is preferably adjusted to be 1 to 100 mol %. When its ratio is less than 1 mol %, the degree of crosslinking of the dry film tends to become insufficient, resulting in lowered resistance to dissolving in the sealer composing resins and reduced solder reflowing efficiency. A high content of the diamine compound having carboxyl group tends to reduce moisture resistance of the dry film. Thus, the preferred ratio of the diamine compound is 5 to 80 mol %, more preferably 10 to 50 mol %.

The heat-resistant resin having amino group in the molecule can be produced by using a triamino compound and a tetraamino compound as a part of the diamine moiety in the synthesis of said polyimide resins or their precursor, polyamide-imide resins or their precursor, and polyamide resins.

Examples of the triamino compounds include 1,3,5-triaminobenzene, 3,4,4'-triaminobiphenyl, 3,5,4'-triaminobiphenyl, 3,4,4'-triaminodiphenyl ether, and 3,5,4'-triaminodiphenyl ether.

Examples of the tetraamino compounds include 3,3',4,4'-tetraaminobiphenyl and 3,3',4,4'-tetraaminodiphenyl ether.

The total amount of the triamino compound and tetraamino compound in the whole amine moiety is preferably adjusted so that their ratio to the diamino compound will be 1–25 to 99–75 in mol %. When the ratio of the triamino and tetraamino compounds is less than 1 mol %, the degree of crosslinking of the dry film tends to become too low, and also resistance to dissolution in the sealer composing resins and solder reflowing efficiency tend to lower. When the ratio exceeds 25 mol %, gelation tends to take place in the resin synthesis. As means for controlling this gelation, it is recommended to use the acid component in an amount of 0.5 to 1.0 mole, preferably 0.8 to 0.98 mole in view of film strength, per mole of the amine component.

A polyimide resin having carboxyl or amino group or its precursor can be obtained by reacting a tetracarboxylic acid anhydride and a diamine compound. It is possible to use a polyimide resin having carboxyl or amino group only at the terminal of the molecule. The amount of the carboxyl group and amino group can be adjusted by controlling the mixing ratios of said materials.

The coupling agent used in the present invention has at least two functional groups in the molecule, at least one of such functional groups being reacted with a polyimide resin having hydroxyl, amino or carboxyl group in the molecule while the other functional group(s) is required to react with polyimide resin having hydroxyl, amino or carboxyl group in the molecular backbone, polyamide-imide resin, their precursors, or polyamide resin, or react with each other. These coupling agents are not subject to any specific regulations regarding molecular structure, molecular weight, etc., as far as they have two or more functional groups. The described type of coupling agent include, for instance, silane coupling agents, titanate coupling agents and aluminum-based coupling agents. The functional groups reacted with said polyimide resin having hydroxyl, amino or carboxyl group in the molecular backbone include epoxy group, amino group, vinyl group and methacryloyl group. Methoxy group and ethoxy group are the typical examples of the functional groups which are self-reacted with the functional group in the coupling agent.

The preferred type of the coupling agent for use in the present invention is the silane coupling agents, the examples of which include γ-(2-aminoethyl)aminopropyltrimethoxysilane, γ-(2-aminoethyl)aminopropylmethyldimethoxysilane, γ-methacryloxypropyltrimethoxysilane, γ-glycidoxypropyltrimethoxysilane, γ-mercaptopropyltrimethoxysilane, vinyltriacetoxysilane, γ-anilinopropyltrimethoxysilane, vinyltrimethoxysilane, γ-mercaptopropylmethyldimethoxysilane, γ-glycidoxypropylmethyldimethoxysilane, γ-ureidopropyltriethoxysilane, and γ-methacryloxypropylmethylenedimethoxysilane.

It is preferable to use a silane coupling agent having epoxy group and methoxysilane group in the molecule, especially γ-glycidoxypropyltrimethoxysilane, with the polyimide resin, polyamide-imide resin, their precursor or polyamide resin having hydroxyl, amino or carboxyl group in the molecule. The thermoresistance adhesive obtained by heat drying a heat-resistant resin composition containing such a coupling agent has a moderately crosslinked structure, so that it does not dissolve in the sealer composing resins at the sealer molding temperature and is capable of providing strong adhesion (especially heat bonding) to the semiconductor chip or lead frame.

The above explanation of the thermoresistance adhesive can be applied to the organic particles (B) in the thermoresistance resin paste. The following is a supplementary explanation on the organic particles.

The heat-resistant resin used in said resin paste is of the type which is soluble in the organic a solvent employed, but the organic particles are the ones which are insoluble in the organic solvent used. It is, however, desirable that both of them have the nature that they dissolve in the respective organic solvents at the temperature used for heat drying.

The organic particles (B) are used for affording thixotropic properties to the paste. The average size of these organic particles is preferably 20 μm or less in view of compatibility with the heat-resistant resin or the reaction product thereof with a crosslinking agent, solubility in the solvent and printability. These organic particles are also preferably the fine particles of a heat-resistant resin whose temperature of 1% weight loss on heating is 250° C. or higher as such particles are helpful to suppress outgassing in the heat treatments or operations at high temperatures, for example, wire bonding. The average size of the organic particles is more preferably 0.1 to 10 μm, especially 5 μm or less. Also, the organic particles are more preferably the fine particles of a heat-resistant resin whose temperature of 1% weight loss on heating is 350° C. or above.

The organic particles (B) are preferably the fine particles of a heat-resistant resin having amide, imide, ester or ether linkage. Such a heat-resistant resin is preferably a polyimide resin or its precursor, a polyamide-imide resin or its precursor or a polyamide resin in view of heat resistance and mechanical properties.

The material of the organic particles (B) may be selected from the above-mentioned polyimide resin or its precursor, polyamide-imide resin or its precursor, and polyamide resin having hydroxyl, amino or carboxyl group, but in these resins, it is not always necessary to contain a diamine compound such as diaminohydroxyl compound, triamino compound, tetraamino compound or diaminocarboxyl compound as essential component.

These fine particles of a heat-resistant resin also need to meet the requirement that they are insoluble in the organic solvent for the thermoresistance resin paste in the present invention before heat drying. Regarding the organic solvent used for the thermoresistance resin paste in the present invention, the explanation given before with reference to the thermoresistance adhesive solution can be applied.

The combinations of heat-resistant resin composing the organic particles and organic solvent in the thermoresistance resin paste of the present invention are exemplified in Table 1. These are but mere examples of the embodiments of the present invention and never restrictive to the scope of the invention. It is also desirable that the heat-resistant resin (A) and the organic particles (B) used in the present invention are compatible with each other. Specifically, there is preferably used a resin (A)/organic particle (B) combination in which the difference in solubility parameter between (A) and (B) is 2.0 or less, more preferably 1.5 or less. The "solubility parameter" referred to herein is the value [unit: (MJ/m3)1/2] determined according to the Fedors method described in Polym. Eng. Sci., Vol. 14, pp. 147–154.

TABLE 1

| Organic particles | | |
|---|---|---|
| X in formula (1) | Y in formula (1) | Solvent |
| —O— | 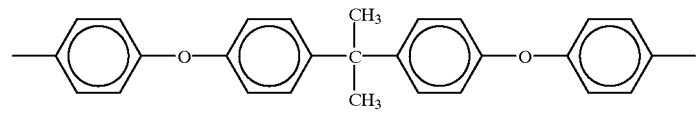 | γ-butyrolactone |
| 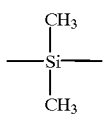 | 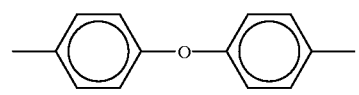 | γ-valerolactone |
| —CO— | 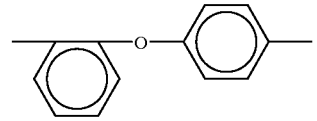 | γ-valerolactone |
| 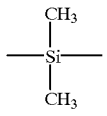 | 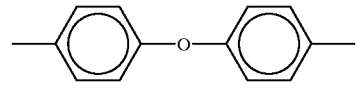 | γ-caprolactone |
| —O— | 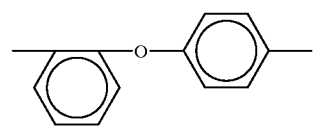 | γ-caprolactone |

TABLE 1-continued

| Organic particles | | Solvent |
|---|---|---|
| X in formula (1) | Y in formula (1) | |
| —CO— | " | γ-caprolactone |
| None/—O— = 1/1 (molar ratio) | " | γ-caprolactone |
| —O— | ![structure with two phenyl-O-phenyl-SO2-phenyl-O-phenyl groups] | γ-caprolactone |
| —CO— / —Si(CH3)2—O—Si(CH3)2— = 0.9/0.1 (molar ratio) | ![phenyl-O-phenyl group] | Propylene carbonate |

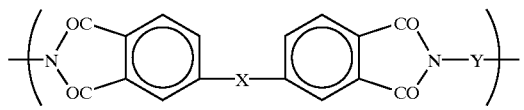

(1)

In the thermoresistance resin paste of the present invention, the ratios of (A) the heat-resistant resin having functional groups such as hydroxyl, amino and carboxyl groups, (B) the fine organic particles, and (C) the crosslinking agent having functional groups chemically bondable to the above-said functional groups such as hydroxyl, amino and carboxyl groups, are as follows: To 100 parts by weight of (A), (B) is 10 to 300 parts by weight and (C) is 1 to 30 parts by weight, preferably (B) is 20 to 300 parts by weight and (C) is 5 to 30 parts by weight, more preferably (B) is 20 to 200 parts by weight and (C) is 10 to 30 parts by weight.

When the ratio of (B) is less than 10 parts by weight, there may not be provided enough thixotropic properties for screen printing, resulting in poor printability. On the other hand, when the ratio of (B) exceeds 300 parts by weight, printability also tends to lower as fluidity of the paste is impaired. When the ratio of (C) is less than 1 part by weight, the degree of crosslinking of the dried version of the paste becomes insufficient, which tends to make the paste composition easily dissoluble in the sealer composing resins at the sealer molding temperature, resulting in reduced resistance to package cracking in solder reflowing. Resistance to dissolution in solvent also tends to lower. When the ratio of (C) exceeds 30 parts by weight, the degree of crosslinking of the dried version of the paste runs too high, which tends to impair adhesion (especially heat bonding) to the semiconductor chip or lead frame. Also, in this case, there is a tendency to suppress the effect of improving resistance to dissolution in solvent.

The thermoresistance adhesive solution and the thermoresistance resin paste according to the present invention are preferably designed to have a thixotropy factor of 1.5 or above, more preferably 2.0 to 5.0, to benefit screen printing. When the thixotropy factor is less than 1.5, it is hard to obtain the desired resolution. It is also desirable that the paste has a viscosity of 10 to 500 Pa·s. When the viscosity is less than 10 Pa·s, it is hardly possible to obtain the desired resolution, and when the viscosity exceeds 500 Pa·s, transferability and printability tend to deteriorate. The viscosity is more preferably 50 to 400 Pa·s, especially 100 to 400 Pa·s. Here, the thixotropy factor is expressed as $\eta_1/\eta_{10}$, or the ratio of apparent viscosity at speed of 1 rpm ($\eta_1$) to apparent viscosity at 10 rpm ($\eta_{10}$), as measured by an E-type viscometer (EHD-U mfd. by Tokyo Keiki KK) at 25° C. using 0.4 g of sample. Viscosity is represented by apparent viscosity at 0.5 rpm, $\eta_{0.5}$.

The said thermoresistance adhesive solution and thermoresistance resin paste can be produced by dissolving or dispersing the component materials in an organic solvent. In case the inorganic or organic particles are contained, such particles are preferably added and dispersed in an organic solvent solution of a heat-resistant resin. When the organic particles are dispersed, the solid heat-resistant resin used as material of the organic particles may be added while being pulverizedid.

The thermoresistance adhesive solution and thermoresistance resin paste containing a heat-resistant resin dissolved in an organic solvent and the organic particles dispersed in an organic solvent can be produced efficiently by the following process.

The thermoresistance resin paste producing process comprises mixing (I) a heat-resistant resin A which is soluble in the solvent of (III) at room temperature and at the temperature used for heat drying, (II) a heat-resistant resin B which is insoluble in the solvent of (III) at room temperature but soluble at the temperature used for heat drying, and (III) a solvent, heating the mixture to dissolve the materials, and then cooling the resulting solution to have the fine particles of the heat-resistant resin B of (II) precipitated and dispersed in the solution of the heat-resistant resin A of (I) and the solvent of (III).

The heat-resistant resin A serves as the main resin component of said thermoresistance resin paste, while the heat-resistant resin B constitutes the organic particles of said thermoresistance resin paste. Therefore, the heat-resistant resin A is soluble in the solvent at room temperature and at the temperature used for heat drying, while the heat-resistant resin B is insoluble in the solvent at room temperature but soluble at the temperature used for heat drying, and when a film of said thermoresistance resin paste is formed by screen printing or other means., and heat dried to form a film pattern, said both resins A and B exist as a homogeneous phase after heat drying.

In consideration of solvent stability, solubility of the resin B in the solvent and productivity, the resin B/solvent combination for use in the present invention is preferably one of those shown in Table 1. Especially a combination in which the heat-resistant resin B is an aromatic polyimide resin obtained by reacting an aromatic tetracarboxylic acid dianhydride containing 50 mol % or more of bis(3,4-dicarboxyphenyl)ether dianhydride and an aromatic diamine containing 50 mol % or more of 2,2-bis[4-(4-aminophenoxy)phenyl]propane, and the solvent is γ-butyrolactone, is preferably used in view of solvent stability, solubility of the resin B in the solvent and productivity. However, the resin B/solvent combinations usable in the present invention are not limited to those mentioned above. The heat drying temperature for the thermoresistance resin paste comprising any of the above combinations is usually 50 to 35° C., and it is desirable to effect rise of temperature stepwise from a low temperature to a high temperature within the above-defined limits.

In the above thermoresistance resin paste producing process, the temperature used for heat dissolving is not specifically defined as far as the mixture of (I) to (III) can be made into a substantially homogeneous transparent solution, but usually the dissolving operation is preferably conducted with stirring at 80 to 250° C. The time used for dissolution is optional, but it is usually 0.1 to 5 hours, preferably 1 to 5 hours. Cooling of the resulting solution can be conducted under suitable conditions that allow precipitation and dispersion of the fine particles of heat-resistant resin B in a mixed solution of heat-resistant resin A and solvent (III), but usually such cooling is preferably effected by allowing the solution to stand at −20° C. to 100° C. under stirring or in a stationary state for one hour to 60 days. For forming the fine particles in a short time, cooling is more preferably conducted with stirring at a specified temperature of from 0° C. to 80° C. for a period of 5 to 80 hours. The rate of cooling from the heat dissolving temperature to the above-defined temperature range of −20° C. to 100° C. may be optionally selected, but it should be noted that rapid cooling tends to induce agglomeration of the precipitated particles, so that usually cooling is preferably performed with stirring at a rate of 0.1 to 10° C./min. The production process is preferably carried out in an inert atmosphere such as an atmosphere of dry nitrogen gas.

According to the thermoresistance resin paste producing process of the present invention, the fine particles of heat-resistant resin B are directly precipitated from a homogeneous solution of heat-resistant resin A and solvent (III), so that in comparison with the conventional process in which the fine particles are once recovered as solid powder by a suitable method—such as mechanical grinding of the powder recovered from the resin solution, forming of the fine particles under high shearing force while adding the resin solution to a poor solvent, or drying of the atomized oily droplets of the resin solution to form the fine particles—and the fine particles are dispersed in a heat-resistant resin composition by mechanical milling such as roll milling or ball milling, the process of the present invention is simple, uncostly and capable of producing the paste with little ionic contamination.

The preferred mixing ratios of heat-resistant resin A, heat-resistant resin B and solvent (III) in the paste according to the present invention are as follows: To 100 parts by weight of heat-resistant resin A, preferably heat-resistant resin B is 10 to 300 parts by weight and solvent (III) is 50 to 3,000 parts by weight, more preferably resin B is 20 to 200 parts by weight and solvent (III) is 75 to 2,000 parts by weight, most preferably resin B is 20 to 200 parts by weight and solvent (III) is 100 to 1,000 parts by weight. When the ratio of heat-resistant resin B is less than 10 parts by weight, the produced paste may fail to have required thixotropic properties for screen printing, resulting in unsatisfactory printability of the paste. When the resin B ratio exceeds 300 parts by weight, fluidity of the paste tends to lower, which also leads to unsatisfactory printability. When the ratio of solvent (III) is less than 50 parts by weight, the paste may lack in fluidity and deteriorate in printability. When its ratio exceeds 3,000 parts by weight, the paste is reduced in viscosity, making it difficult to form a thick film and impairing resolving performance.

In the above process, heat-resistant resin A, heat-resistant resin B and solvent (III) may be mixed in an arbitrary order and heated simultaneously with or after mixing to form a homogeneous solvent. Also, resin A and resin B may be severally mixed with solvent (III), followed by further mixing under heating. Heating may be conducted after mixing or simultaneously with mixing to prepare a homogeneous solution.

Further, in the above thermoresistance resin paste producing process, the material of heat-resistant resin B may be supplied into a solution of heat-resistant resin A and solvent (III), and after dissolving the material in the solution, they may be reacted at a temperature which does not cause precipitation of resin B in the solution of resin A and solvent (III) to synthesize heat-resistant resin B, followed by cooling to have the fine particles of resin B precipitated and dispersed in the solution of resin A and solvent (III). This is also a preferable method in the present invention. As the material of heat-resistant resin B, those mentioned above can be used.

In the above thermoresistance resin paste producing process, it is also a preferable method to supply the material of heat-resistant resin A into a solution of heat-resistant resin B and solvent (III), react the mixture (after said material has been dissolved) at a temperature which does not cause precipitation of the fine particles of resin B in the solution of resin B and solvent (III) to synthesize heat-resistant resin A, and then cool the solution to have the fine particles of resin B precipitated and dispersed in the solution of resin A and solvent (III). As the material of heat-resistant resin A, those mentioned above can be used.

According to these methods, it is possible to produce the thermoresistance resin paste consecutively with a single reaction vessel, which contributes to simplification of the process and prevention of contamination with foreign materials such as dust from the working environment.

In the present invention, the fine particles of heat-resistant resin B are used for affording thixotropic properties to the paste. As for the size of the fine particles of heat-resistant resin B, considering compatibility of resin B with resin A, thixotropic properties and thin film forming properties, it is desirable that the particles be precipitated and dispersed with the maximal particle size not exceeding 10 $\mu$m, preferably falling in the range of 0.05 to 5 $\mu$m. When the maximal particle size is less than 0.05 $\mu$m, thixotropic properties of the paste are intensified too much with a small content of the particles. Therefore, the content of the fine particles of heat-resistant resin B in the paste is reduced, making it difficult to increase the resin concentration. The particle size can be controlled by, for instance, adjusting the stirring rate and temperature used for precipitating the particles. The higher the stirring rate or temperature, the smaller becomes the particle size. It is preferable to select an appropriate temperature that causes precipitation of the resin B particles from between room temperature and 100° C.

In the above thermoresistance resin paste producing process, in case a heat-resistant resin having functional groups such as hydroxyl, amino or carboxyl group in the molecule is used as resin A, it is possible to add a crosslinking agent having functional groups chemically bondable to the aforesaid functional groups (such as hydroxyl, amino or carboxyl group) after the paste has been formed by dispersing the fine particles of resin B in the solution of resin A and solvent (III). The additives which are optionally used as required are preferably added after the paste has been formed by dispersing the fine particles of resin B in the solution of resin A and solvent (III).

The thermoresistance adhesive according to the present invention preferably has a glass transition temperature lower than the adhesion temperature of a semiconductor chip and the inner leads of a lead frame. Considering adhesion between the semiconductor chip and the inner leads of lead frame, it is desirable that the glass transition temperature of said adhesive is 20 to 50° C. lower than the adhesion temperature.

The thermoresistance adhesive according to the present invention is typically the one whose temperature of 1% weight loss on heating is preferably 350° C. or above, more preferably 380° C. or above. When the said temperature is below 350° C., outgassing is liable to take place in the high-temperature heat treatment steps, for example, in the wire bonding operation, making it unable to secure reliability of the produced semiconductor device. The temperature causing weight loss on heating can be determined by TG-DTA300 (mfd. by Seiko Instruments Inc. Co., Ltd.) at a heating rate of 10° C./min in the air using 10 mg of sample.

Sealers are essentially composed of base resin, curing agent resin, curing accelerator, modifier, and organic or inorganic filler. Of these materials, base resin and curing agent resin are specified in the present invention. Examples of such base resin and curing agent resin usable in the present invention include epoxy resins, phenolic resins, bismaleimide resins, epoxysilicone resins, phenolic silicone resins, silicone resins, diallyl phthalate resins, alkyd resins, dicyclopentadiene-phenol addition compounds, dicycloepoxy resins produced by reacting epichlorohydrin with dicyclopentadiene-phenol addition compounds, and phenolamino group-containing compound-formalin addition compounds. Of these resins, preferred are epoxy resins and phenolic resins which excel in moldability, molded product quality and economy and are popularly used in the art.

In the present invention, it is possible to use all types of epoxy resins as far as they contain at least two epoxy groups in the molecule, examples of such epoxy resins including epi-bis type epoxy resins such as bisphenol A, bisphenol AD, bisphenol S, bisphenol F and halogenated bisphenol A and epichlorohydrin condensates, biphenyl type epoxy resins, orthocresol novolak epoxy resins, phenolic novolak epoxy resins, bisphenol A novolak epoxy resins, and halides of these epoxy resins, such as brominated phenolic novolak resins and brominated epi-bis type epoxy resins.

It is also possible to use all types of phenolic resins containing at least two phenolic hydroxyl groups in the molecules, examples of such phenolic resins including phenolic novolak resins, cresol novolak resins, bisphenol A novolak resins, poly-p-vinylphenol, phenolic aralkyl resins, and xylylene phenolic novolak resins.

As epoxy resin in the present invention, it is preferred to use epi-bis epoxy resins, biphenyl epoxy resins, orthocresol novolak epoxy resins, brominated phenolic novolak epoxy resins and brominated epi-bis epoxy resins as they excel in moldability, molded product quality and economy and are popularly used in the art.

The thermoresistance adhesive according to the present invention is characterized by the fact that it does not dissolve in the sealer composing resins at the sealer molding temperature, and naturally does not dissolve in the sealers themselves at their molding temperature.

In the present invention, the sealer molding temperature of 120 to 200° C. is selected as a preferred condition as this range of temperature is generally adopted for the treatments of the sealer composing resins. The thermoresistance adhesive of the present invention does not dissolve in the sealer composing resins in this range of molding temperature. The time in which the thermoresistance adhesive is allowed to contact with the sealer composing resins at the molding temperature is preferably defined to 3 to 150 seconds which is the actual molding time of the sealer.

The thermoresistance adhesive according to the present invention is capable of bonding a semiconductor chip and a lead frame with an adhesive strength under shear of 1 N/4 $MM^2$ or greater. Considering reliability of the produced semiconductor device, such adhesive strength under shear is preferably 5 N/4 $mm^2$ or greater, more preferably 10 N/4 $mm^2$ or greater. The greater the adhesive strength under shear, the more desirable. In the present invention, it is possible to provide an adhesive strength under shear of as high as 60 N/4 $mm^2$ or even greater, up to a maximum of about 200 N/4 $mm^2$.

The thermoresistance adhesive solution or thermoresistance resin paste according to the present invention may be applied on a semiconductor chip and dried to obtain a semiconductor chip having a thermoresistance adhesive layer.

Also, the thermoresistance adhesive solution or thermoresistance resin paste of this invention may be applied to a lead frame and dried to obtain a lead frame having a thermoresistance adhesive layer.

Further, the thermoresistance adhesive solution or thermoresistance resin paste according to this invention may be applied on one side or both sides of a support film such as a polyimide film, polyester film or polycarbonate film and dried to obtain a film having a thermoresistance adhesive layer.

Various methods such as spin coating, dispensing, potting and printing can be employed for said application of the thermoresistance adhesive solution or thermoresistance resin paste of the present invention. It is remarkable that in accordance with the present invention, a thick-film high-precision fine pattern can be produced with good productivity and at low cost by a single coating operation by applying a heat-resistant resin composition having a viscosity of 100 to 400 Pa·s and a thixotropy factor of 2.0 to 5.0 by printing method and drying the coating. The printing method is preferably screen printing.

The temperature for heat drying of the thermoresistance adhesive solution or thermoresistance resin paste of the present invention is preferably set at 350° C. or lower, more preferably 300° C. or lower, even more preferably 280° C. or lower. When the drying temperature is higher than 350° C., the intermolecular reaction of the heat-resistant resin tends to advance excessively, lowering fusibility and adhesiveness (heat bonding properties) of the adhesive or paste. It usually suffices for the purpose to conduct drying at 50 to 350° C. for one to 150 minutes.

The said polyimide precursor or polyamideimide resin precursor is preferably subjected to ring-closing reaction in the course of heat drying to effect imidization.

The thermoresistance adhesive of the present invention is fused at the bonding temperature after said heat drying to effect heat bonding of the adherends. The adhesive is not subject to any specific restrictions except that it should be the one which can be fused in its entirety after heat drying to effect desired heat bonding, but it is especially preferable that the components of the adhesive, i.e. heat-resistant resins, their reaction products or the reaction products with other components and, in some cases, the organic particles, are all capable of being fused at the bonding temperature.

The thus obtained semiconductor chip or lead frame having a thermoresistance adhesive layer is heat bonded to a lead frame or semiconductor chip, respectively. Heat bonding is usually conducted at 200 to 400° C. under a load of 0.1 to 10 MPa for a period of 0.1 to 10 seconds. In order to minimize damage to the semiconductor chip (such as disconnection of the electric circuits), it is desirable that the bonding operation be conducted at a lowest possible temperature under a smallest possible load for a shortest possible period.

Adhesion by use of the adhesive tape, adhesive film or adhesive sheet according to the present invention is effected by pressing the adherend to the adhesive side of said tape, film or sheet and bonding the semiconductor chip and the lead frame simultaneously or in any desired order. In the case of an adhesive tape, adhesive film or adhesive sheet having an adhesive applied on one side alone of the base, the semiconductor chip or lead frame is bonded to the adhesive-applied side and the adhesive layer of the lead frame or semiconductor chip is attached to the no-adhesive side of the base. It is also possible to bond the lead frame or semiconductor chip to the no-adhesive side of the base by interposing therebetween an adhesive tape, film or sheet made of the thermoresistance adhesive alone.

Bonding by the thermoresistance adhesive according to the present invention is preferably conducted at 200 to 400° C under a load of 0.1 to 10 MPa. The bonding time may be properly decided depending on the situation, but usually a period of 0.1 to 10 seconds is sufficient.

By using a thermoresistance adhesive solution, a film having a thermoresistance adhesive layer, a semiconductor chip having a thermoresistance adhesive layer and a lead frame having a thermoresistance adhesive layer according to the present invention, it is possible to produce a high-capacity and high-reliability semiconductor device by a simple process in a high yield and at low cost. For example, a semiconductor device can be produced by bonding the plural inner leads of lead frame on the circuit-forming surface of each semiconductor chip with the intervention of the thermoresistance adhesive of the present invention which electrically insulates the semiconductor chip, then electrically connecting the semiconductor chip and the inner leads of lead frame by means of wire bonding, and finally sealing with a sealer.

It is also possible to produce a semiconductor device by bonding the inner leads of lead frame on the circuit-forming surface of each semiconductor chip having a thermoresistance adhesive layer of this invention with the intervention of a thermoresistance adhesive layer, electrically connecting the semiconductor chip and the inner leads of lead frame by wire bonding, and sealing with a sealer.

A semiconductor device can also be produced by bonding the inner leads of lead frame having a thermoresistance adhesive layer of this invention on the circuit-forming surface of each semiconductor chip with the intervention of a thermoresistance adhesive layer, electrically connecting the semiconductor chip and the inner leads of lead frame by wire bonding, and sealing with a sealer.

In the semiconductor device according to the present invention, it is desirable that the entirety of the circuit-formed area, excepting the bonding pad of each semiconductor chip and fuse circuit, be covered with a film of a heat-resistant resin such as polyimide resin. This heat-resistant resin film serves as a circuit protective film or an α-ray shield. It also contributes to lessening chip damage (such as disconnection of electric circuits) when applying a heat-resistant resin composition containing the inorganic or organic particles of this invention on the semiconductor chip by screen printing.

The semiconductor chip used in the present invention is preferably the one having a thermoresistance adhesive layer obtained by attaching a perforated adhesive-applied metal or resin film with a Young's modulus of 2 GPa or greater to a semiconductor wafer, injecting said heat-resistant resin or heat-resistant resin composition into the holes in the film by a dispenser or other means, squeegeing the film, then peeling the film after drying if necessary, and dicing it. According to this method, a thermoresistance adhesive layer can be formed with minimized risk of chip damage (such as disconnection of electric circuits).

As bonding wire in the present invention, there can be used Au wire, Al wire, Cu wire or the like.

As lead frame, for instance the one made of a Fe—Ni alloy (Ni content: 42% or 50%) or Cu may be used.

Figure 2:
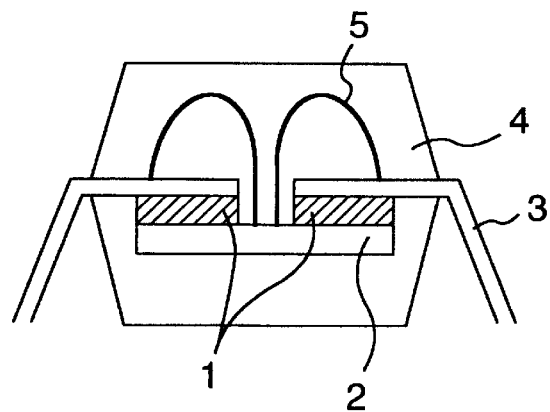
FIG. 2 is a schematic illustration of a structure of the semiconductor device of this invention in which the semiconductor chip is also positioned on the lower side of the lead frame.
Figure 3:
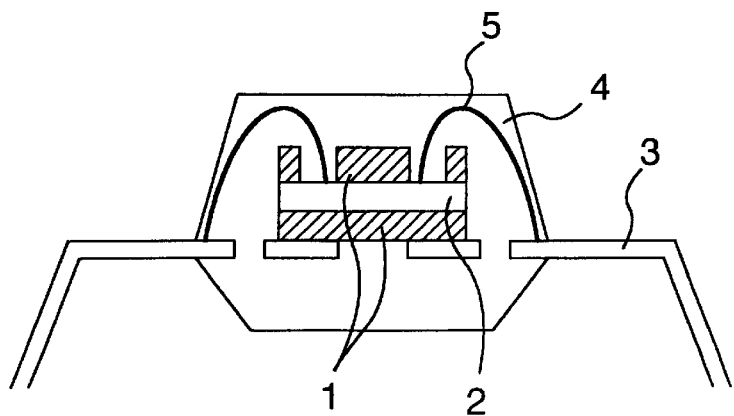
FIG. 3 is a schematic illustration of a structure of the semiconductor device of this invention in which the semiconductor chip is positioned on the upper side of the lead frame.

The semiconductor device according to the present invention may have the structures such as illustrated in FIGS. 1 to 3.

FIG. 1 is a schematic sectional view of a semiconductor device produced by bonding each semiconductor chip 2 and lead frame 3 through the medium of a thermoresistance adhesive 1 applied only at the portion to be bonded of the lead frame, and sealing the semiconductor chip 2, the bonded portion of semiconductor chip 2 and lead frame 3, and the bonding wires 5 by a sealer, wherein the semiconductor chip 2 is positioned beneath the lead frame 3.

FIG. 2 is a schematic sectional illustration of a semiconductor device produced by bonding each semiconductor chip 2 and lead frame 3 through the medium of a heat-resistant resin layer 1 formed over the entire circuit-formed area excepting the bonding pad of semiconductor chip 2 and the fuse circuit, and sealing the semiconductor chip 2, the bonded portion of semiconductor chip 2 and lead frame 3 and the bonding wires 5 by a sealer, wherein the semiconductor chip 2 is positioned beneath the lead frame 3.

FIG. 3 is a schematic sectional view of a semiconductor device produced by forming a thermoresistance adhesive layer 1 over the entire circuit-formed area excepting the bonding pad of semiconductor chip 2 and the fuse circuit as a buffer coat, bonding the semiconductor chip 2 and lead frame 3 through the medium of the thermoresistance adhesive layer 1 formed over the whole rear side of the semiconductor chip 2, and sealing the semiconductor chip 2, the bonded portion of semiconductor chip 2 and lead frame 3 and the bonding wires 5 by a sealer, wherein the semiconductor chip 2 is positioned upwards of the lead frame 3.

In a preferred mode of practice of such semiconductor device producing process, a thermoresistance adhesive layer is formed on the semiconductor chip by applying a heat-resistant resin or a heat-resistant resin composition over the entire surface of the chip excepting the wire bonding pad or at the portion to be bonded to the lead frame, the lead frame is heat bonded under pressure to said thermoresistance adhesive layer of the conductor chip, then the lead frame and semiconductor chip are joined by Au wire or such, and the elements are sealed by transfer molding with an epoxy resin sealer.

The present invention will be further illustrated by the following Examples and Comparative Examples, but the present invention is not limited thereto.

EXAMPLE 1

To a 1,000 ml four-necked flask equipped with a stirrer, a thermometer, a nitrogen gas inlet pipe and a condenser provided with an oil/water separator, 36.00 g (0.18 mol) of 4,4'-diaminodiphenyl ether (hereinafter abbreviated to DDE), 73.90 g (0.18 mol) of 2,2-bis[4-(4-aminophenoxy)phenyl]propane (hereinafter abbreviated to BAPP), 9,93 g (0.04 mol) of 1,3-bis(aminopropyl)tetramethyldisiloxane, 128.8 g (0.40 mol) of 3,4,3',4'-benzophenonetetracarboxylic acid dianhydride (hereinafter abbreviated to BTDA) and 373 g of γ-butyrolactone (hereinafter abbreviated to BL) were supplied while blowing nitrogen gas through the solution. Reaction was allowed to proceed with stirring at 50 to 60° C. for 5 hours to obtain a polyamide acid resin solution with a resin content of 40 wt %.

This polyamide acid resin solution was bar coated on a glass plate (approximately 2 mm thick) to a coating thickness after heat drying of 20 μm, and heat treated at 140° C. for 15 minutes, at 200° C. for 15 minutes and then at 300° C. for 60 minutes to imidizate the polyamide acid to obtain a glass plate having a polyimide resin coating film. This polyimide resin coated glass plate was heated to 180° C., and about 0.1 g of pellets of each of the sealer-composing resins, viz. YX-4000H (trade name of a bisphenyl epoxy resin produced by Yuka Shell Co., Ltd.), ESCN-190 (trade name of an orthocresol novolak epoxy resin produced by Sumitomo Chemical Co., Ltd.), HP-850N (trade name of a phenolic novolak resin produced by Hitachi Chemical Company, Ltd.) and XL-225 (trade name of a xylylene phenolic novolak resin produced by Mitsui Chemicals, Inc.) were placed severally on the polyimide resin coating film of said glass plate and allowed to stand at 180° C. for 2 minutes, after which the molten resin left on the polyimide resin coating film was wiped off at the same temperature. A film dissolving test was conducted by observing the condition of dissolution of the polyimide resin coating film in said sealer-composing resins. As a result, in the case of the orthocresol novolak epoxy resin ESCN-190, there was observed no change at all in appearance of the film, indicating that the polyimide resin film does not dissolve in said sealer resin. In the case of the biphenyl epoxy resin YX-4000H and the phenolic novolak resin HP-850N, although a sign of dissolution was admitted at the area contacted with the resin pellets, there was noted no formation of hollows or holes in the polyimide resin coating film that could have resulted from dissolution of the film in these resins and consequent formation of a molten fluid, indicating that the polyimide resin coating film does not dissolve in these sealer resins.

The polyimide resin coating film was peeled off said coated glass plate, and the glass transition temperature (Tg) of the separated film (cut into a 3 mm×20 mm test piece) was determined by a thermophysical tester TMA-120 (mfd. by Seiko Instruments Inc.) under a load of 8 g at a heating rate of 5° C. It was found that Tg was 235° C.

The above polyamide acid resin solution was bar coated on a silicon wafer (approximately 0.65 mm thick) to a coating thickness after heat drying of 20 μm, and heat treated at 140° C. for 15 minutes, at 200° C. for 15 minutes and at 300° C. for 60 minutes to imidizate the polyamide acid to obtain a silicon wafer having a polyimide resin coating film. This polyimide resin coated silicon wafer was diced to obtain a 2 mm×2 mm polyimide resin coated silicon chip. This polyimide resin coated silicon chip was heat bonded to a Fe—Ni alloy (Ni content: 42%, hereinafter referred to as 42 alloy) plate for lead frame, with the polyimide resin coating film serving as an adhesive layer, under the conditions of 300° C., 0.2 MPa and 5 seconds, and its adhesive strength under shear was measured by Dage's automatic adhesion tester Microtester BT-22 (measuring temperature: 25° C.; testing rate: 0.5 mm/S). The adhesive strength under shear thus determined was 2.5 N/2×2 mm².

The above polyamide resin solution was diluted with BL to a viscosity of 10 Pa·s, applied on a semiconductor substrate (wafer) by a coater (SC-W80A mfd. by Dainippon Screen Mfg. Co., Ltd.), and heat treated (pre-baked) on a hot plate at 90° C. for 120 seconds to obtain a 19 μm thick pre-baked film. On this pre-baked film was applied a phenolic novolak photo-sensitive resin (positive photoresist for soldering, trade name: OFPR-5000, produced by Tokyo Ohka Kogyo Co., Ltd.) by using the said coater to form a positive resist layer. Then, in order to selectively remove the bonding pad portion and the scribing line alone, the 100 μm square bonding pad and 70 μm scribing line width were exposed by photoetching to melt the irradiated area, and then the development of the positive resist layer and etching of the pre-baked film were conducted continuously at 23° C. for 160 seconds by using an aqueous tetramethylammonium hydroxide solution developer (trade name: NMD-3 produced by Tokyo Ohka Kogyo Co., Ltd.) as etching solution to expose the bonding pad portion. Then a resist releasing solution (n-butyl acetate) for etching the positive resist layer alone was applied dropwise over the whole wafer surface from a spray nozzle and treated at room temperature for 90 seconds to perfectly remove the positive resist layer. Then the wafer was put into a hot air dryer and heat treated at 200° C. for 15 minutes, at 250° C. for 15 minutes and at 300° C. for 60 minutes to imidizate the polyamide acid to obtain a wafer having a 15 μm thick polyimide resin coating film, and this polyimide resin coated wafer (0.65 mm thick) was diced to obtain a polyimide resin coated semiconductor chip. To the polyimide resin coating film of this semiconductor chip was heat bonded a 42 alloy-made lead frame 3, as shown in FIG. 2, under the conditions of 300° C., 0.1 MPa and 5 seconds. Then, the lead frame and the semiconductor chip were joined by Au-made bonding wires 5 and sealed by transfer molding with a biphenyl epoxy resin sealer CEL-9200 (trade name, produced by Hitachi Chemical Company, Ltd.) containing said four sealer-composing resins. The adhesive interface between the polyimide resin coating film and the sealer layer of the semiconductor device (package) having the structure shown in FIG. 2 was examined by a supersonic flaw detector, but no exfoliation at the interface was observed (0/30, which means none of 30 samples suffered exfoliation). The obtained semiconductor device (package) was allowed to absorb moisture by leaving it in an atmosphere of 85° C. and 85% RH for 168 hours and subjected to infrared reflowing (240° C., 10 seconds), but no package crack was observed (0/30, which means none of 30 samples had cracks).

EXAMPLE 2

To a 1,000 ml four-necked flask equipped with a stirrer, a thermometer, a nitrogen gas inlet pipe and a condenser provided with an oil/water separator, 65.69 g (0.16 mol) of BAPP, 143.22 g (0.40 mol) of bis(3,4-dicarboxylphenyl) sulfone dianhydride (hereinafter abbreviated to DSDA), 38.84 g (0.20 mol) of isophthalic acid dihydrazide (hereinafter abbreviated to IPDH), 9.93 g (0.04 mol) of 1,3-bis(aminopropyl)tetramethyldisiloxane and 478 g of BL were supplied while blowing nitrogen gas through the solution. After one-hour reaction at 50 to 60° C. with stirring, the temperature was raised to 195° C. and the reaction was continued at this temperature for 6 hours. Water generated in the course of the reaction was rapidly removed out of the reaction system. The resulting solution was diluted with BL to obtain a polyamide-imide resin solution with a resin concentration of 30% by weight.

To a 1,000-ml four-necked flask equipped with a stirrer, a thermometer, a nitrogen gas inlet pipe and a condenser provided with an oil/water separator, 102.64 g (0.25 mol) of BAPP, 77.55 g (0.25 mol) of bis(3,4-dicarboxyphenyl)ether dianhydride (hereinafter abbreviated to ODPA) and 335 g of BL were supplied while blowing nitrogen gas through the solution. After conducting the reaction at 50 to 60° C. for one hour with stirring, the temperature was raised to 195° C. and the reaction was allowed to proceed at this temperature for 5 hours. Water generated during the reaction was rapidly removed out of the reaction system. The resulting solution was diluted with BL to a resin concentration of 30% by weight and allowed to stand at 23° C. for one month to give a solid polyimide resin for filler containing the solvent.

To a 1,000 ml four-necked flask equipped with a stirrer, a thermometer, a nitrogen gas inlet pipe and a condenser, 200 g of said solvent-containing solid polyimide resin for filler (resin concentration: 30 wt %) in the pulverized form was supplied and heated to 180° C. The solution was stirred at this temperature for one hour to form a homogeneous solution, and to this solution was added 466.67 g of the previously prepared polyamide-imide resin solution (resin concentration: 30 wt %), followed by one-hour stirring at 180 C. The mixed a solution was cooled to 23° C. over a period of about one hour and allowed to stand as such for one month. As a result, the fine polyimide resin particles were precipitated and dispersed in the solution to give a polyimide resin paste having a viscosity of 380 Pa·s and a thixotropy factor (hereinafter referred to as TI value) of 2.9. The recovered polyimide resin particles had a maximal size of 20 $\mu$m and was insoluble in BL at room temperature but soluble at 150° C.

Using the above polyimide resin paste, a glass plate having a polyimide resin coating film was obtained in the same way as in Example 1. This coating film was homogeneous and transparent, indicating that the polyimide resin particles in the polyimide resin paste were dissolved in BL in the process of curing and were also sufficiently compatible with the polyamide-imide resin. The state of dissolution of this polyimide resin coating film in the sealer-composing resins was examined in the same way as in Example 1. As a result, in the case of the orthocresol novolak epoxy resin ESCN-190, there was seen no change at all in appearance of the film, indicating that the coating film does not dissolve in this resin. In the case of the biphenyl epoxy resin YX-4000H, phenol novolak resin HP-850N and xylylene phenolic novolak resin XL-225, although a trace of dissolution was admitted at the area contacted with the resin pellets, there was observed no formation of hollows or holes in the polyimide resin film attributable to its dissolution in these resins and consequent formation of a molten fluid, indicating that the coating film does not dissolve in these resins. Tg of the coating film, as measured in the same way as in Example 1, was 256° C. Using the said polyimide resin paste, the adhesive strength under shear to a 42 alloy plate was determined in the same way as in Example 1 except that bar coating on a silicon wafer (approximately 0.65 mm thick) was replaced by screen printing. The adhesive strength was 5.0 N/2×2 mm$^2$.

The said polyimide resin paste was coated over the whole chip surface excepting the bonding pad portion by using a screen printer (LS-34GX with aligning means, mfd. by Newlong Seimitsu Kogyo Co., Ltd.), and heat treated at 140° C. for 15 minutes, at 200° C. for 15 minutes and at 300° C. for 60 minutes to obtain a semiconductor wafer with a 18 $\mu$m thick polyimide resin coating film. The adhesive interface between the polyimide resin coating film and the sealer layer of a semiconductor device (package) obtained in the same way as in Example 1 using said semiconductor wafer was examined by a supersonic flaw detector. There was observed no exfoliation at the interface (0/30). Also, the semiconductor device (package) was allowed to absorb moisture by leaving it in an atmosphere of 85° C. and 85% RH for 168 hours and then subjected to infrared reflowing (240° C., 10 seconds). No package crack took place (0/30).

EXAMPLE 3

To a 1,000-ml four-necked flask equipped with a stirrer, a thermometer, a nitrogen gas inlet pipe and a condenser with an oil/water separator, 102.64 g (0.25 mol) of BAPP, 127.83 g (0.357 mol) of DSDA, 23.13 g (0.107 mol) of 2,2-bis(4-hydroxy-3-aminophenyl)propane (hereinafter abbreviated to HAB) and 380 g of N-methylpyrrolidone (hereinafter abbreviated to NMP) were supplied while blowing nitrogen gas through the solution. After one-hour reaction at 50 to 60° C. with stirring, the temperature was raised to 195° C. and the reaction was continued at this temperature for 5 hours. Water generated in the course of the reaction was rapidly removed out of the reaction system. The resulting solution was diluted with NMP to obtain a polyimide resin solution with a resin concentration of 40% by weight.

To 200 g of this polyimide resin solution was added 8 g of γ-glycidoxypropyltrimethoxysilane (hereinafter abbreviated to GPS), followed by mixing well at room temperature to obtain a polyimide resin composition.

Using this polyimide resin composition, a glass plate with a polyimide resin composition coating film was obtained in the same way as in Example 1. Dissolubility of this polyimide resin composition coating film in the sealer-composing resins was examined in the same way as in Example 1. As a result, in the case of the orthocresol novolak epoxy resin ESCN-190, there was observed no change at all in appearance of the film, indicating that the coating film does not dissolve in this resin. In the case of the biphenyl epoxy resin YX-4000H, phenolic novolak resin HP-850N and xylylene phenolic novolak resin XL-225, although a trace of dissolution was admitted in the area contacted with the resin pellets, there was observed no formation of hollows or holes in the coating film attributable to its dissolution in these resins and consequent formation of a molten fluid, indicating that the coating film does not dissolve in these resins. Tg of the coating film, as determined in the same way as in Example 1, was 262° C. The adhesive strength under shear of said polyimide resin composition to a 42 alloy plate, as determined in the same way as in Example 1, was 11 N/2×2 mm$^2$.

The above polyimide resin composition was coated on both sides of a 50 $\mu$m thick polyimide film (Upilex S produced by Ube Industries, Ltd.) so that the coating thickness on each side of the film after heat drying would become 25 $\mu$m, and then heat treated at 140° C. for 15 minutes, at 200° C. for 15 minutes and at 300° C. for 60 minutes to obtain a polyimide resin composition coated film. This coated film was cut to a size of 1.5 mm×10 mm and placed between a 42 alloy-made lead frame 3 and a semiconductor chip 2 as shown in FIG. 1, and they were heat bonded under the conditions of 300° C., 0.2 MPa and 5 seconds. Then, the lead frame and the semiconductor chip were joined by Au bonding wires 5 and sealed by transfer molding with a biphenyl epoxy resin sealer CEL-9200 (trade name, produced by Hitachi Chemical Company, Ltd.). The adhesive interface between the polyimide resin composition coating film and the sealer layer of the obtained semiconductor device (package) was examined by a supersonic flaw detector. There was observed no exfoliation at the interface (0/30). The semiconductor device (package) was allowed to absorb moisture by leaving it in an atmosphere of 85° C. and 85% RH for 168 hours and then subjected to infrared reflowing (240° C., 10 seconds). There took place no package cracking (0/30).

EXAMPLE 4

To a 1,000-ml four-necked flask equipped with a stirrer, a thermometer, a nitrogen gas inlet pipe and a condenser provided with an oil/water separator, 89.09 g (0.217 mol) of BAPP, 119.59 g (0.334 mol) of DSDA, 42.85 g (0,117 mol) of 2,2-bis(4-hydroxy-3-aminophenyl)hexafluoropropane (hereinafter abbreviated to HAB-6F) and 377 g of BL were supplied while blowing nitrogen gas through the solution. After one-hour reaction at 50 to 60° C. with stirring, the temperature was raised to 195° C. and the reaction was continued at this temperature for 5 hours. Water generated in the course of the reaction was rapidly removed out of the reaction system. The resulting solution was diluted with BL to obtain a polyimide resin solution with a resin concentration of 40% by weight.

To a 1,000-ml four-necked flask equipped with a stirrer, a thermometer, a nitrogen gas inlet pipe and a condenser, 400 g of the solvent-containing solid polyimide resin for filler obtained in Example 2 (resin concentration: 30 wt %) was supplied in the pulverized form and heated to 180° C. The solution was stirred at this temperature for one hour to form a homogeneous solution, and to this solution was added 300 g of said polyimide resin solution (resin concentration: 40 wt %), followed by stirring at 180° C. for one hour. The solution was cooled to 23° C. over a period of about one hour and allowed to stand as such for one month. As a result, the fine particles of the polyimide resin were precipitated and dispersed in the solution to give a paste. To this paste, 48 g of GPS was added and mixed well at room temperature, and the mixture was diluted with BL to a resin concentration of 36% by weight. The obtained polyimide resin paste had a viscosity of 280 Pa·s and a TI value of 3.3. The maximal size of the recovered polyimide resin particles was 20 μm, and the particles were insoluble in BL at room temperature but soluble at 150° C.

Using the above polyimide resin paste, a glass plate having a polyimider resin coating film was obtained in the same way as in Example 1. This coating film was homogeneous and transparent, indicating that the polyimide resin particles in said polyimide resin paste were dissolved in BL in the process of drying and also well compatible with the polyimide resin. Dissolubility of this polyimide resin coating film in the sealer-composing resins was examined in the same way as in Example 1. As a result, in the case of the orthocresol novolak epoxy resin ESCN-190, there took place no change at all in appearance of the film, indicating that the coating film does not dissolve in this resin. In the case of the biphenyl epoxy resin YX-4000H, phenolic novolak resin HP-850N and xylylene phenolic novolak resin XL-225, although a trace of dissolution was admitted in the area contacted with the resin pellets, there was observed no formation of hollows or holes in the polyimide resin coating film attributable to its dissolution in these resins and consequent formation of a molten fluid, indicating that the coating film does not dissolve in these resins. Tg of the coating film, as determined in the same way as in Example 1, was 256° C. Adhesive strength under shear of said polyimide resin paste to a 42 alloy plate, as determined in the same way as in Example 1 except that bar coating on a silicon wafer (approximately 0.65 mm thick) was replaced by screen printing, was 12 N/2×2 mm$^2$.

Using said polyimide resin paste, a semiconductor device (package) was made in the same way as in Example 2 except that print coating on the chip surface other than the bonding pad portion was conducted by applying said polyimide resin paste on the portion of the chip surface where the lead frame was to be bonded, other than the bonding pad portion, and exfoliation at the interface between the polyimide resin coating film and the sealer layer was examined by a supersonic flaw detection. There was observed no exfoliation (0/30). Also, the semiconductor device (package) was allowed to absorb moisture by leaving it in an atmosphere of 85° C. and 85% RH for 168 hours and then subjected to infrared reflowing (240° C., 10 seconds), during which no package cracking occurred (0/30).

EXAMPLE 5

The polyimide resin paste of Example 4 was print coated on the portion of a 42 alloy-made lead frame to be bonded to a semiconductor chip by a screen printer (LS-34GX with an aligning means, mfd. by Newlong Seimitsu Kogyo Co., Ltd.), and then heat treated at 140° C. for 15 minutes, at 200° C. for 15 minutes and at 300° C. for 60 minutes to obtain a lead frame having a 18 μm thick polyimide resin coating film. This lead frame was heat bonded to a semiconductor chip 2 as shown in FIG. 1 under the conditions of 300° C., 0.2 MPa and 5 seconds. Then, the lead frame and the semiconductor chip were joined by Au bonding wires 5 and sealed by transfer molding with a orthocresol novolak resin sealer CEL7700SX (trade name, produced by Hitachi Chemical Company, Ltd.) 4. The adhesive interface between the polyimide resin coating film and the sealer layer of the obtained semiconductor device (package) was examined by a supersonic flaw detector, but no exfoliation was observed (0/30). Also, the obtained semiconductor device (package) was allowed to absorb moisture by leaving it in an atmosphere of 85° C. and 85% RH for 168 hours and then subjected to infrared reflowing (240° C., 10 seconds). There took place no package cracking (0/30).

COMPARATIVE EXAMPLE 1

The same procedure as conducted in Example 1 was carried out except that the mixture of DDE and BAPP was replaced by 72.36 g (0.36 mol) of DDE alone, that the acid dianhydride BTDA was replaced by a mixture of 64.48 g (0.20 mol) of BTDA and 43.64 g (0.20 mol) of pyromellitic acid dianhydride, and that the solvent BL was replaced by 449 g of NMP to obtain a polyamide acid resin solution.

Using this polyamide acid resin solution, a glass plate having a polyimide resin coating film was obtained in the same way as in Example 1. Dissolubility of this polyimide resin coating film in the sealer-composing resins was examined in the same way as in Example 1. As a result, with any of the biphenyl epoxy resin YX-4000H, orthocresol novolak epoxy resin ESCN-190, phenolic novolak resin HP-850N and xylylene phenolic novolak resin XL-225, there was observed no change at all in appearance of the film, indicating that the coating film does not dissolve in these resins. Tg of the coating film, as determined in the same way as in Example 1, was 305° C. However, when it was tried to determine the adhesive strength under shear of the coating film to a 42 alloy plate by using said polyamide acid resin solution in the same way as in Example 1, the 42 alloy plate didn't bond at all to the polyimide resin coating film and it was impossible to determine the adhesive strength.

Using the polyamide acid resin solution diluted with BL to a viscosity of 10 Pa·s, a semiconductor chip having a 16 μm thick polyimide resin coating film with a bonding pad portion was obtained in the same way as in Example 1. It was tried to make a semiconductor device (package) by using said semiconductor chip in the same way as in Example 1, but the 42 alloy-made lead frame didn't bond at all to the polyimide resin coating film of the semiconductor chip and it was impossible to produce and evaluate a semiconductor device.

COMPARATIVE EXAMPLE 2

A polyimide resin solution was obtained by following the same synthesis procedure as in Example 2 except that instead of using a mixture of BAPP and IPDH of the diamine moiety, 247.8 g (0.36) of BAPP alone was used. Then the process of Example 2 was followed except for use of said polyimide resin solution and a solvent-containing solid polyimide resin for filler of Example 2 to obtain a polyimide resin paste having a viscosity of 230 Pa·s and a TI value of 2.8. The recovered polyimide resin particles had a maximal size of 20 μm or less, and were insoluble in BL at room temperature but soluble at 150° C.

Using this polyimide resin paste, a glass plate having a polyimide resin coating film was obtained in the same way as in Example 1. This coating film was homogeneous and transparent. Dissolubility of this polyimide resin coating film in the sealer-composing resins was examined in the same way as in Example 1. As a result, the coating film dissolved in any of the bisphenyl epoxy resin YX-4000H, orthocresol novolak epoxy resin ESCN-190, phenolic novolak resin HP-850N and xylylene phenolic novolak resin XL-225 to form a molten fluid, and the holes of about 5 mm in diameter reaching the substrate glass plate were formed in the polyimide resin coating film. Tg of the coating film, as measured in the same way as in Example 1, was 220° C. Adhesive strength under shear of the coating film to an 42 alloy plate, measured by using said polyimide resin paste in the same way as in Example, was 16 N/2×2 mm².

Said polyimide resin paste was coated on the chip surface excepting the bonding pad portion in the same way as in Example 2 to obtain a semiconductor wafer having a polyimide resin coating film. The adhesive interface between the polyimide resin coating film and the sealer layer of a semiconductor device (package) made by using said semiconductor wafer in the same way as in Example 3 was examined. Exfoliation at the interface was seen in all of the samples tested (30/30, which indicates that 30 out of 30 samples suffered exfoliation). When the semiconductor device (package) was allowed to absorb moisture by leaving it in an atmosphere of 85° C. and 85% RH for 168 hours and then subjected to infrared reflowing (240° C., 10 seconds), there took place package cracking in all of the samples tested (30/30).

COMPARATIVE EXAMPLE 3

A polyimide resin solution was obtained by following the same synthesis as in Example 4 except that instead of using a mixture of BAPP and HAB-6F of the diamine moiety, 37.12 g (0.334 mol) of BAPP alone was used. Then the same procedure as defined in Example 4 was repeated except for use of said polyimide resin solution and the solvent-containing solid polyimide resin for filler used in Example 2 to obtain a polyimide resin paste having a viscosity of 330 Pa·s and a TI value of 3.2. The maximal size of the recovered polyimide resin particles was 20 μm or less, and the particles were insoluble in BL at room temperature but soluble at 150° C.

Using this polyimide resin paste, a glass plate having a polyimide resin coating film was obtained in the same way as in Example 1. This coating film was homogeneous and transparent. Dissolubility of this polyimide resin coating film in the sealer-composing resins was examined in the same way as in Example 1. As a result, the coating film dissolved in any of the biphenyl epoxy resin YX-4000H, orthocresol novolak epoxy resin ESCN-190, phenolic novolak resin HP-850N and xylylene phenolic novolak resin XL-225 to form a molten fluid, and the holes of 5 mm in diameter reaching the base glass plate were formed in the polyimide coating film. Tg of the coating film, measured in the same way as in Example 1, was 235° C. Adhesive strength under shear of the coating film to a 42 alloy plate, measured by using said polyimide resin paste in the same way as in Example 1, was 15 N/2×2 mm².

A semiconductor device (package) was made in the same way as in Example 2 except that said polyimide resin paste was print coated on the area of the chip surface where the lead frame was to be bonded, other than the bonding pad portion, and the adhesive interface between the polyimide resin coating film and the sealer layer of said semiconductor device (package) was examined by a supersonic flaw detector. Exfoliation at the interface took place in all of the samples (30/30). When the semiconductor device (package) was allowed to absorb moisture by leaving it in an atmosphere of 85° C. and 85% RH for 168 hours and then subjected to infrared reflowing (240° C., 10 seconds), package cracking occurred in all of the samples (30/30).

COMPARATIVE EXAMPLE 4

The same polyimide resin paste preparation process as used in Example 4 was conducted except that no GPS was added to obtain a polyimide resin paste having a viscosity of 360 Pa·s and a TI value of 3.5.

Using this polyimide resin paste, a glass plate having a polyimide resin coating film was obtained in the same way as in Example 1. This coating film was homogeneous and transparent. Dissolubility of this polyimide resin coating film in the sealer-composing resins was examined in the same way as in Example 1. As a result, the coating film dissolved in any of the biphenyl epoxy resin YX-4000H, orthocresol novolak epoxy resin ESCN-190, phenolic novolak resin HP-850N and xylylene phenolic novolak resin XL-225 to form a molten fluid, and the holes of about 5 mm in diameter reaching the base glass plate were formed in the polyimide resin coating film. Tg of the coating film measured in the same way as in Example 1 was 235° C. Adhesive strength under shear of the coating film to a 42 alloy plate measured by using said polyimide resin paste in the same way as in Example 1 was 15 N/2×2 mm².

Using said polyimide resin paste, a semiconductor device (package) was obtained in the same way as in Example 2 except that the paste was applied on the area of the chip surface where the lead frame was to be bonded, other than the bonding pad portion, and the adhesive interface between the polyimide resin film and the sealer layer was examined by a supersonic flaw detector. As a result, exfoliation at the interface occurred in 18 of the 30 samples (18/30). Also, when the obtained semiconductor device (package) was allowed to absorb moisture by leaving it in an atmosphere of 85° C. and 85% RH for 168 hours and then subjected to infrared reflowing (240° C., 10 seconds), package cracking took place in 11 out of the 30 samples (11/30).

COMPARATIVE EXAMPLE 5

A polyimide resin paste having a viscosity of 380 Pa·s and a TI value of 3.6 was obtained in the same way as in Example 1 except that an orthocresol novolak epoxy resin ESCN-190 was added, instead of GPS, to the polyimide resin paste.

Using this polyimide resin paste, a glass plate having a polyimide resin coating film was obtained in the same way as in Example 1. This coating film was homogeneous and transparent. Dissolubility of this polyimide resin coating film in the sealer composing resins was examined in the same way as in Example 1. As a result, in the case of the biphenol epoxy resin YX-4000H and orthocresol novolak epoxy resin ESCN-190, there took place no change at all in appearance of the film, indicating that the coating film does not dissolve in these resins. In the case of the phenolic novolak resin HP-850N and xylylene pehnolic novolak resin XL-225, although a trace of dissolution was admitted in the area contacted with the resin pellets, there was observed no formation of hollows or holes in the coating film attributable to its melting in these resins and consequent formation of a molten fluid, indicating that the coating film does not dissolve in these resins. Tg of the coating film measured in the same way as in Example 1 was 275° C. It was tried to measure adhesive strength under shear of the coating film to a 42 alloy plate in the same way as in Example 1 by using said polyimide resin paste, but the 42 alloy plate did not bond at all to the polyimide resin coating film and it was impossible to measure adhesive strength.

Using said polyimide resin paste, a semiconductor wafer having a 18 μm thick polyimide resin coating film was obtained in the same way as in Example 2 by coating the polyimide resin paste on the chip surface excepting the bonding pad portion. This semiconductor wafer was diced into a semiconductor chip, and it was tried to make a semiconductor device (package) by using this semiconductor chip in the same way as in Example 1, but since the 42 alloy-made lead frame did not bond at all to the polyimide resin coating film of the semiconductor chip, it was impossible to make and evaluate a semiconductor device.

COMPARATIVE EXAMPLE 6

A polyimide resin paste having a viscosity of 290 Pa·s and a TI value of 3.4 was obtained in the same way as in Example 4 except that 4,4'-diphenylmethanebismaleimie (produced by Mitsui Chemicals Inc.) was added in place of GPS to the polyimide resin paste.

Using this polyimide resin paste, a glass plate having a polyimide resin coating film was obtained in the same way as in Example 1. This coating film was homogeneous and transparent. Dissolubility of this polyimide resin coating film in the sealer composing resins was examined in the same way as in Example 1. As a result, in the case of the biphenyl epoxy resin YX-4000H and orthocresol novolak epoxy resin ESCH-190, there took place no change at all in appearance of the coating film, indicating that the coating film does not dissolve in these resins. In the case of the phenolic novolak resin HP-850N and xylylene phenolic novolak resin XL-225, although a trace of dissolution was admitted in the area contacted with the resin pellets, there was observed no formation of hollows or holes in the coating film attributable to its dissolution in these resins and consequent formation of a molten fluid, indicating that the polyimide coating film does not dissolve in these resins. Tg of the coating film measured in the same way as in Example 1 was 280° C. It was tried to determine adhesive strength under shear of the coating film to a 42 alloy plate by using said polyimide resin paste in the same way as in Example 1, but the 42 alloy plate did not bond at all to the polyimide resin coating film and it was impossible to measure adhesive strength.

Using said polyimide resin paste, a semiconductor wafer having a 18 μm thick polyimide resin coating film was obtained in the same way as in Example 2 by coating the polyimide resin paste on the chip surface excepting the bonding pad portion. This wafer was diced into a semiconductor chip, and it was tried to make a semiconductor device (package) by using this semiconductor chip in the same way as in Example 1, but the 42 alloy-made lead frame did not bond at all to the polyimide resin coating film of the semiconductor chip and it was impossible to make and evaluate a semiconductor device.

The foregoing results are shown collectively in Table 2 below.

TABLE 2

| Properties | Example 1 | Example 2 |
|---|---|---|
| Dissolubility in sealer-composing resins | | |
| YX-4000H | Did not dissolve (showed a trace of dissolution) | Did not dissolve (showed a trace of dissolution |
| ESCN-190 | Did not dissolve | Did not dissolve |
| HP-850N | Did not dissolve (showed a trace of dissolution) | Did not dissolve (showed a trace of dissolution) |
| XL-225 | Did not dissolve (showed a trace of dissolution) | Did not dissolve (showed a trace of dissolution) |
| Adhesive strength under shear to 42 alloy plate (N/mm$^2$) | 2.5 | 5.0 |
| Tg (° C.) | 235 | 256 |
| Early exfoliation of package (Number of exfoliated samples/ number of samples tested) | 0/30 | 0/30 |

TABLE 2-continued

| | | | |
|---|---|---|---|
| Package cracking (Number of samples which cracked/number of samples tested) | 0/30 | | 0/30 |

| | Example 3 | Example 4 | Example 5 |
|---|---|---|---|
| | Did not dissolve (showed a trace of dissolution) | Did not dissolve (showed a trace of dissolution) | Did not dissolve (showed a trace of dissolution) |
| | Did not dissolve | Did not dissolve | Did not dissolve |
| | Did not dissolve (showed a trace of dissolution) | Did not dissolve (showed a trace of dissolution) | Did not dissolve (showed a trace of dissolution) |
| | Did not dissolve (showed a trace of dissolution) | Did not dissolve (showed a trace of dissolution | Did not dissolve (showed a trace of dissolution |
| | 11 | 12 | 12 |
| | 262 | 256 | 256 |
| | 0/30 | 0/30 | 0/30 |
| | 0/30 | 0/30 | 0/30 |

| Properties | Comp. Example 1 | Comp. Example 2 |
|---|---|---|
| Dissolubility in sealer-composing resins | | |
| YX-4000H | Did not dissolve | Dissolved |
| ESCN-190 | Did not dissolve | Dissolved |
| HP-850N | Did not dissolve | Dissolved |
| XL-225 | Did not dissolve | Dissolved |
| Adhesive strength under shear to 42 alloy plate (N/mm$^2$) | Did not bond (Unmeasurable) | 16 |
| Tg (° C.) | 305 | 220 |
| Early exfoliation of package (Number of exfoliated samples/number of samples tested) | — (Unmeasurable) | 30/30 |
| Package cracking (Number of samples which cracked/number of samples tested) | — (Unmeasurable) | 30/30 |

| Comp. Example 3 | Comp. Example 4 | Comp. Example 5 | Comp. Example 6 |
|---|---|---|---|
| Dissolved | Dissolved | Did not dissolve | Did not dissolve |
| Dissolved | Dissolved | Did not dissolve | Did not dissolve |
| Dissolved | Dissolved | Did not dissolve (showed a trace of dissolution) | Did not dissolve (showed a trace of dissolution) |
| Dissolved | Dissolved | Did not dissolve (showed a trace of dissolution) | Did not dissolve (showed a trace of dissolution) |
| 15 | 15 | Did not bond (Unmeasurable) | Did not bond (Unmeasurable) |
| 235 | 235 | 275 | 280 |
| 30/30 | 18/30 | — (Unmeasurable) | — (Unmeasurable) |
| 30/30 | 11/30 | — (Unmeasurable) | — (Unmeasurable) |

As is seen from the results of Comparative Examples 2 to 4, in the case of the coating film which is dissolved in the sealer composing resins at the sealer molding temperature (180° C.) to form a molten fluid, a weak adhesive layer is formed at the interface between the sealer and the thermoresistance adhesive, so that there takes place initial exfoliation of the package and also package cracking tends to occur in infrared reflowing after moisture absorption. Also, as is noted from the results of Comparative Examples 1, 5 and 6, even if the coating film does not dissolve in the sealer composing resins at the sealer molding temperature (180° C.), if Tg of the coating film is too high or the selection of the curing system is improper, there is provided no sufficient adhesive strength under shear to the 42 alloy plate, making it unable to bond the lead frame and the semiconductor chip. On the other hand, as is learned from the results of Examples 1 to 5, in the case of a coating film which does not dissolve in the sealer composing resins at the sealer molding temperature (180° C.) and has an adhesive strength under shear of 1 N/2×2 mm$^2$ to a 42 alloy plate, which was realized by providing an appropriate Tg or by selecting proper components, no weak adhesive layer is formed at the interface between the sealer and the heat-resistant resin, so that the coating film shows excellent sealer bondability and suffers no initial exfoliation, and further, no package cracking occurs in infrared reflowing after moisture absorption, ensuring high package reliability.

EXAMPLE 6

To a 1,000-ml four-necked flask equipped with a stirrer, a thermometer, a nitrogen gas inlet pipe and a condenser provided with an oil/water separator, 73.90 g (0.18 mol) of 2,2-bis[4-(4-aminophenoxy)phenyl]propane (hereinafter abbreviated to BAPP), 119.59 g (0.334 mol) of bis(3,4-dicarboxyphenyl)sulfone dianhydride (hereinafter abbreviated to DSDA), 17.78 g (0.117 mol) of 1,3-diamino-5-carboxybenzene and 377 g of γ-butyrolactone (hereinafter abbreviated to BL) were supplied while blowing nitrogen gas through the solution. After one-hour reaction with stirring at 50 to 60° C., the temperature was raised to 195° C. and the reaction was allowed to proceed at this temperature for 5 hours. Water generated in the course of the reaction was rapidly removed out of the reaction system. The resulting solution was diluted with BL to obtain a polyimide resin solution with a resin concentration of 40% by weight.

To a 1,000-ml four-necked flask equipped with a stirrer, a thermometer, a nitrogen gas inlet pipe and a condenser provided with an oil/water separator, 77.55 g (0.25 mol) of bis(3,4-dicarboxyphenyl)ether dianhydride (hereinafter abbreviated to ODPA) and 335 g of BL were supplied while blowing nitrogen gas through the solution. After conducting the reaction with stirring at 50 to 60° C. for one hour, the temperature was raised to 195° C. and the reaction was allowed to proceed at this temperature for 5 hours. Water generated during the reaction was rapidly removed out of the reaction system. The resulting solution was diluted with BL to a resin concentration of 30% by weight and allowed to stand at 23° C. for one month. A solid polyimide resin for filler containing the solvent was obtained.

To a 1,000-ml four-necked flask equipped with a stirrer, a thermometer, a nitrogen gas inlet pipe and a condenser, 200 g of said solvent-containing solid polyimide resin for filler (resin concentration: 30 wt %) in the pulverized form was supplied and heated to 180° C. The resin was stirred at this temperature for one hour to form a homogeneous solution, and to this solution was added 300 g of the previously prepared polyimide resin solution (resin concentration: 40 wt %), followed by one-hour stirring at 180° C. The solution was cooled to 23° C. over a period of about one hour and allowed to stand as such for one month. As a result, the fine particles of polyimide resin were precipitated and dispersed in the solution to form a paste. To this paste, 27 g of γ-glycidoxypropyltrimethoxysilane (hereinafter abbreviated to GPS) was added and mixed well at room temperature, and the mixture was diluted with BL to a resin concentration of 32% by weight to obtain a thermoresistance resin paste having a viscosity of 250 Pa·s and a thixotropy factor (hereinafter referred to as TI value) of 2.8. The maximal size of the recovered polyimide resin particles was 20 μm, and the particles were insoluble in BL at room temperature but soluble at 150° C.

The above thermoresistance resin paste was bar coated on a glass plate (approximately 2 mm thick) to a coating thickness after heat drying of 20 μm, and then heat dried at 140° C. for 15 minutes, at 200° C. for 15 minutes and at 300° C. for 60 minutes to obtain a glass plate having a polyimide resin coating film. During this heat drying treatment, reaction of hydroxyl, amino or carboxyl group in the heat-resistant resin molecule with the crosslinking agent proceeded. This polyimide resin-coated glass plate was heated to 180° C., and about 0.1 g of pellets of the sealer composing resins, i.e. a bisphenol epoxy resin YX-400H (trade name, produced by Yuka Shell Co., Ltd.), an orthocresol novolak epoxy resin ESCN-190 (trade name, produced by Sumitomo Chemical Company, Ltd.), a phenolic novolak resin HP-850N (trade name, produced by Hitachi Chemical Company, Ltd.) and xylylene phenolic novolak resin XL-225 (trade name, produced by Mitsui Chemicals, Inc.) were placed severally on the polyimide resin coating film of said glass plate and allowed to stand at 180° C. for 2 minutes. Thereafter, the molten resin left on the polyimide resin coating film was wiped off at the same temperature. A dissolubility test was conducted by observing the condition (degree) of dissolution of the polyimide resin coating film caused by said resins. As a result, in the case of the orthocresol novolak epoxy resin ESCN-190, there took place no change at all in appearance of the coating film, indicating that the coating film does not dissolve in this resin. In the case of the biphenyl epoxy resin XY-4000H, phenolic novolak resin HP-850N and xylylene phenolic novolak resin XL-225, although a trace of dissolution was admitted at the portion where the resin pellets contacted, there was observed no formation of hollows or holes in the coating film attributable to its dissolution in these resins and consequent formation of a molten fluid. This indicates that said polyimide resin coating film does not dissolve in these resins.

The polyimide resin coating film was peeled off said coated glass plate, and the glass transition temperature (Tg) of this film (test piece: 3 mm×20 mm) was measured by a thermophysical tester TMA-120 (mfd. by Seiko Instruments Inc.) under a load of 8 g and at a heating rate of 5° C./min. Tg was 265° C.

Said thermoresistance resin paste was bar coated on a silicon wafer (approximately 0.65 mm thick) to a coating thickness after heat drying of 20 μm, and then heat dried at 140° C. for 15 minutes, at 200° C. for 15 minutes and at 300° C. for 60 minutes to obtain a silicon wafer having a polyimide resin coating film. This polyimider resin coated silicon wafer was diced into a 2 mm×2 mm silicon chip having a polyimide resin coating film. Said polyimide resin coated silicon chip was heat bonded to a Fe—Ni alloy (Ni content: 42%, hereinafter abbreviated to 42 alloy) plate for lead frame with the polyimide resin coating film serving as adhesive layer, under the conditions of 300° C., 0.2 MPa and 5 seconds, and its adhesive strength under shear was measured by Dage's automatic adhesion tester Microtester BT-2 (measuring temperature: 25° C., testing rate: 0.5 mm/S). It was determined to be 10 N/2×2 mm².

Said thermoresistance resin paste was coated on the chip surface excepting the bonding pad portion on a semiconductor substrate (wafer) by a screen printer (LS-34GX with aligning means, mfd. by Newlong Seimitsu Kogyo Co., Ltd.), and then heat dried at 140° C. for 15 minutes, at 200° C. for 15 minutes and at 300° C. for 60 minutes to obtain a semiconductor wafer having a 20 μm thick polyimide resin coating film. This polyimide resin coated wafer (approximately 0.65 mm thick) was diced to obtain a semiconductor chip having a polyimide resin coating film. A 42 alloy-made lead frame 3 was heat bonded to the polyimide resin coating film of said semiconductor chip as shown in FIG. 2 under the conditions of 300° C., 0.1 MPa and 5 seconds. Then the lead frame and the semiconductor chip were joined by Au bonding wires and sealed by transfer molding with a biphenyl epoxy resin sealer CEL-9200 (trade name, produced by Hitachi Chemical Company, Ltd.) 4. The adhesive interface between the polyimide resin coating film and the sealer of the obtained semiconductor device having the structure shown in FIG. 2 was examined by a supersonic flaw detector. There was observed no exfoliation at the interface (0/30, which indicates that none of the 30 samples suffered exfoliation). Also, when the semiconductor device (package) was allowed to absorb moisture by leaving it in an atmosphere of 85° C. and 85% RH for 168 hours and then subjected to infrared reflowing (240° C., 10 seconds), package cracking occurred in none of the 30 samples (0/30).

COMPARATIVE EXAMPLE 7

A heat-resistant resin paste having a viscosity of 210 Pa·s and a TI value of 3.3 was obtained in the same way as in Example 6 except that no GPS was added to the polyimide resin paste.

Using this thermoresistance resin paste, a glass plate having a polyimide resin coating film was obtained in the same way as in Example 6. This film was homogeneous and transparent. Dissolubility of this polyimide resin coating film in the sealer composing resins was examined in the same way as in Example 6. As a result, the coating film dissolved in any of the bisphenyl epoxy resin YX-4000H, orthocresol novolak epoxy resin ESCN-190, phenolic novolak resin HP-850N and xylylene phenolic novolak resin XL-225 to form a molten fluid, which formed in the coating film the holes of about 5 mm in diameter reaching the base glass plate. Tg of the coating film measured in the same way as in Example 6 was 236° C. Adhesive strength under shear of the coating film to a 42 alloy plate measured by using said polyimide resin paste in the same way as in Example 6 was 17 N/2×2 mm².

Using said thermoresistance resin paste, a semiconductor device (package) was made in the same way as in Example 1 except that the paste was print coated on the portion of the chip surface where the lead frame was to be bonded, other than the bonding pad portion, and the adhesive interface between the polyimide resin coating film and the sealer layer of said semiconductor device (package) was examined by a supersonic flaw detector. Exfoliation at the interface was observed in all of the samples tested (30/30). Also, when the obtained semiconductor device (package) was allowed to absorb moisture by leaving it in an atmosphere of 85° C. and 85% RH for 168 hours and then subjected to infrared reflowing (240° C., 10 seconds), package cracking occurred in all of the samples (30/30).

As is seen from the results of Comparative Examples 3 and 7 described above, a paste using a heat-resistant resin having no hydroxyl group in the molecule or a paste made of a heat-resistant resin having carboxyl group in the molecule but using no crosslinking agent falls short of the degree of crosslinking and dissolves in the sealer composing resins at the sealer molding temperature (180° C.) to form a molten fluid, and a new weak adhesive layer is formed at the interface between the sealer and the thermoresistance adhesive, so that the package suffers early exfoliation. Also, in infrared reflowing after moisture absorption, package cracking occurs. On the other hand, as is seen from the results of Examples 4, 5 and 6 described above, in the case of a paste provided with appropriate Tg or prepared by selecting the proper components, moderate crosslinking is provided in the molecular structure, and therefore such a paste does not dissolve in the sealer composing resins at the sealer molding temperature (180° C.) and also its adhesive strength under shear to a 42 alloy plate becomes greater than 1 N/2×2 mm². Further, since no new weak adhesive layer is formed at the interface between the sealer and the thermoresistance adhesive, sealer adhesion is enhanced and there takes place no early exfoliation of the package. Also, no package cracking occurs in infrared reflowing after moisture absorption, providing high package reliability.

EXAMPLE 7

To a 1,000-ml four-necked flask equipped with a stirrer, a thermometer, a nitrogen gas inlet pipe and a condenser provided with an oil/water separator, 65.69 g (0.16 mol) of 2,2-bis[4-(4-aminophenoxy)phenyl]propane (hereinafter abbreviated to BAPP), 132.22 g (0.,40 mol) of bis(3,4-ddicarboxyphenyl)sulfone dianhydride (hereinafter abbreviated to DSDA), 38.84 g (0.20 mol) of isophthalic acid dihydrazide, 9.93 g (0.04 mol) of 1,3-bis(3-aminopropyl)tetramethyldisiloxane and 478 g of γ-butyrolactone were supplied while blowing nitrogen gas through the solution. After one-hour reaction with stirring at 50 to 60° C., the temperature was raised to 195° C. and the reaction was allowed to proceed at this temperature. At the point when the number-average molecular weight became 27,000 (calculated as polystyrene), the reaction mixture was cooled to stop the reaction. Water generated during the reaction was rapidly removed out of the reaction system. The resulting solution was diluted with γ-butyrolactone to obtain a polyamide resin (heat-resistant resin A) solution with a resin concentration of 30% by weight.

To a 1,000-ml four-necked flask equipped with a stirrer, a thermometer, a nitrogen gas inlet pipe and a condenser provided with an oil/water separator, 102.64 g (0.25 mol) of BAPP, 77.55 g (0.25 mol) of bis(3,4-dicarboxyphenyl)ether dianhydride (hereinafter abbreviated to ODPA) and 335 g of γ-butyrolactone were supplied while blowing nitrogen gas through the solution. After one-hour reaction with stirring at 50 to 60° C., the temperature was raised to 195° C. and the reaction was allowed to proceed at this temperature. At the point when the number-average molecular weight became 28,000 (calculated as polystyrene), the reaction mixture was cooled to stop the reaction. Water generated in the course of the reaction was rapidly removed out of the reaction system. The resulting solution was diluted with γ-butyrolactone to obtain a polyimide resin (heat-resistant resin B) solution for filler with a resin concentration of 30% by weight.

To a 1,000-ml four-necked flask equipped with a stirrer, a thermometer, a nitrogen gas inlet pipe and a condenser, 200 g of said polyimide resin solution for filler (resin concentration: 30 wt %) and 466.67 g of said polyamide-imide resin solution (resin concentration: 30 wt %), both fresh from the synthesis, were added, mixed and stirred at 180° C. for one hour to form a homogeneous transparent solution. The solution was cooled down to 23° C. over a period of about one hour and allowed to stand as such for one month, whereupon the fine particles of the polyimide resin were precipitated and dispersed in the solution. This solution was diluted with γ-butyrolactone to obtain a polyimide resin paste having a viscosity of 380 Pa·s and a thixotropy factor (hereinafter referred to as TI value) of 2.5. The maximal size of the recovered polyimide resin particles was 5 μm, and the particles were insoluble in γ-butyrolactone at room temperature but soluble at 150° C.

Said polyimide resin paste was bar coated on a glass plate (approximately 2 mm thick) to a coating thickness after heat drying of 20 μm, and then heat treated at 140° C. for 15 minutes, at 200° C. for 15 minutes and at 300° C. for 60 minutes to obtain a glass plate having a cured polyimide resin coating film. The cured coating film was substantially homogeneous and transparent, indicating that the fine particles of the polyimide resin (heat-resistant resin B) in the polyimide resin paste are soluble in γ-butyrolactone and also compatible with the polyamide-imide resin (heat-resistant resin A).

EXAMPLE 8

The same synthesis procedure as described in Example 7 was conducted except that the amount of BAPP used was increased to 147.8 g (0.36 mol), and that no isophthalic acid dihydrazide was used to obtain a polyimide resin (heat-resistant resin A) solution having a number-average molecular weight of 28,000 (calculated as polystyrene).

To a 1,000-ml four-necked flask equipped with a stirrer, a thermometer, a nitrogen gas inlet pipe and a condenser provided with an oil/water separator, 102.64 g (0.25 mol) of BAPP, 77.55 g (0.25 mol) of ODPA and 335 g of γ-butyrolactone were supplied while blowing nitrogen gas through the solution. After one-hour reaction with stirring at 50 to 60° C., the temperature was raised to 195° C. and the reaction was allowed to proceed at this temperature. At the point when the number-average molecular weight became 28,000 (calculated as polystyrene), the reaction mixture was cooled to stop the reaction. Water generated in the course of the reaction was rapidly removed out of the reaction system. The resulting solution was diluted with γ-butyrolactone to a resin concentration of 30% by weight. Then the solution was cooled to 23° C. and allowed to stand as such, consequently giving a solid polyimide resin (heat-resistant resin B) solution for filler containing the solvent.

To a 1,000-ml four-necked flask equipped with a stirrer, a thermometer, a nitrogen gas inlet pipe and a condenser, 200 g of said solid polyimide resin for filler (resin concentration: 30 wt %), which has been pulverized to particles, and 466.67 g of said polyimide resin (heat-resistant resin A) solution were added, mixed and stirred at 180° C. for one hour to form a homogeneous transparent solution. The solution was then cooled to 50° C. over a period of about one hour and stirred at 50° C. for 3 days, whereupon the fine particles of the polyimide resin were precipitated and dispersed in the solution. This solution was diluted with γ-butyrolactone to obtain a polyimide resin paste having a viscosity of 280 Pa·s and a TI value of 2.8. The maximal size of the recovered polyimide resin particles was 5 μm or less, and the particles were insoluble in γ-butyrolactone at room temperature but soluble at 150° C.

Using said polyimide resin paste, a glass plate having a cured polyimide resin coating film was obtained in the same way as in Example 7. The cured coating film was substantially homogeneous and transparent, indicating that the polyimide resin particles in the polyimide resin paste dissolved in γ-butyrolactone in the curing process and were also compatible with the polyimide resin (heat-resistant resin A).

EXAMPLE 9

To a 1,000-ml four-necked flask equipped with a stirrer, a thermometer, a nitrogen gas inlet pipe and a condenser provided with an oil/water separator, 89.09 g (0.217 mol) of BAPP, 119.59 g (0.334 mol) of DSDA, 42.85 g (0.117 mol) of 2,2-bis(4-hydroxy-3-aminophenyl)hexafluoropropane (hereinafter abbreviated to HAB-6F) and 377 g of γ-butyrolactone were supplied while blowing nitrogen gas through the solution. After one-hour reaction with stirring at 50 to 60° C., the temperature was raised to 195° C. and the reaction was allowed to proceed at this temperature. At the point when the number-average molecular weight became 26,000 (calculated as polystyrene), the reaction mixture was cooled to stop the reaction. Water generated in the course of the reaction was rapidly removed out of the reaction system. The resulting solution was diluted with γ-butyrolactone to obtain a polyimide resin (heat-resistant resin A) solution with a resin concentration of 40% by weight.

To a 1,000-ml four-necked flask equipped with a stirrer, a thermometer, a nitrogen gas inlet pipe and a condenser, 400 g of the solvent-containing solid polyimide resin (heat-resistant resin B) for filler (resin concentration: 30 wt %) obtained in Example 8 was supplied in the pulverized form and heated to 180° C. The solution was stirred at this temperature for one hour to form a homogeneous solution, to which 300 g of said polyimide resin solution (resin concentration: 40 wt %) was added and stirred at 180° C. for one hour. Then the solution was cooled to 60° C. over a period of about one hour and stirred at this temperature for one day, whereupon the fine particles of the polyimide resin were precipitated and dispersed in the solution to give a paste. To this paste was added 48 g of γ-glycidoxypropyltrimethoxysilane, followed by sufficient mixing at room temperature, and the mixture was diluted with γ-butyrolactone to a resin concentration of 36% by weight. The thus obtained polyimide resin paste had a viscosity of 150 Pa·s and a TI value of 3.5. The maximal size of the recovered polyimide resin particles was 5 μm or less, and the particles were insoluble in γ-butyrolactone at room temperature but soluble at 150° C.

Using said polyimide resin paste, a glass plate having a polyimide resin coating film was obtained in the same way as in Example 1. This coating film was substantially homogeneous and transparent, indicating that the polyimide resin particles in the polyimide resin paste dissolved in γ-butyrolactone in the curing process and were also compatible with the polyimide resin (heat-resistant resin A). Also, this coating film had a three-dimensional crosslinked molecular structure and was possessed of excellent solvent resistance as well as resistance to dissolution in epoxy resins at 180° C.

The following properties of the said paste were evaluated.
(1) Printability

Printing was made on a silicon wafer by a screen printer (LS-34GX with an aligning means, mfd. by Newlong Seimitsu Kogyo Co., Ltd.) using a nickel alloy-made meshless metal plate (50 μm thick, pattern size: 8 mm×8 mm, mfd. by Mesh Industry Co., Ltd.) and a Permalex metal squeegee (imported by Tomoe Kogyo KK), and printability was evaluated according to the following criterion:

Good: No blotting or broadening occurred, and good transfer was made.

Bad: Blotting and broadening occurred, and transfer was bad.

(2) Ionic Impurity Content

Na ions and Fe ions were determined by atomic-absorption spectroscopy.

(3) Number of Contaminants

In a clean bench of Class 100, the paste was bar coated on a glass plate (approximately 2 mm thick) to a coating thickness after heat drying of 20 μm, and heat treated at 140° C. for 15 minutes, at 200° C. for 15 minutes and at 300° C. for 60 minutes to obtain a glass plate having a cured coating film. The number of the contaminants with a size of 20 μm or greater present in the area of 5 cm×5 cm of said cured coating film was determined by a microscope.

(4) Glass Transition Temperature (Tg)

The cured coating film obtained according to (3) was peeled off the glass plate, and the glass transition temperature of this film (sample size: 3 mm×20 mm) was measured by a thermophysical tester TMA-120 (mfd. by Seiko Electronic Industry Co., Ltd.) at a heating rate of 5° C./min under a load of 8 g.

The results are shown collectively in Table 3.

TABLE 3

| Properties | | Example 7 | Example 8 | Example 9 |
|---|---|---|---|---|
| Maximal size of resin particles (μm) | | 5 or less | 5 or less | 5 or less |
| Viscosity (Pa.s) | | 380 | 280 | 150 |
| TI value | | 2.5 | 2.8 | 3.5 |
| Ionic impurity content (ppm) | Na | 0.9 | 0.6 | 1.0 |
| | Fe | 1.0 | 0.8 | 0.7 |
| Printability | | Good | Good | Good |
| Number of contaminants | | 0 | 0 | 0 |

TABLE 3-continued

| Properties | Example 7 | Example 8 | Example 9 |
|---|---|---|---|
| Tg (° C.) | 256 | 270 | 260 |
| Number of paste producing steps | 3 | 3 | 3 |

As is seen from the results of Examples 7 to 9, the thermoresistance resin paste obtained according to the process of the present invention excels in forming thin films as the maximal size of the fine particles of the heat-resistant resin B can be defined to 5 µm or less. Also, since the whole process for production of the paste can be conducted in a flask, the ionic impurity content is low and the number of contaminants is small, so that the paste is especially suited for semiconductor applications. Further, the paste of this invention is economically advantageous as the number of its production steps can be lessened.

INDUSTRIAL APPLICABILITY

The thermoresistance adhesive and thermoresistance adhesive solution of the present invention are useful as adhesive materials for semiconductor devices with high package reliability as such adhesive materials can afford high sealer adhesion and also no package cracking occurs in infrared reflowing after moisture absorption.

The thermoresistance adhesive solution of the present invention, as worked into a paste, is capable of forming a thick-film, high-fineness pattern on a substrate by printing method, so that this adhesive solution is high in productivity and useful as an adhesive material for manufacture of low-cost semiconductor devices. Further, in case the thermoresistance adhesive solution of this invention contains organic particles for providing thixotropic properties, the organic particles are compatibilized with the heat-resistant resin which becomes a binder when heated, making it possible to form a homogeneous film free of pinholes or voids. Therefore, the obtained thermoresistance adhesive is useful as an adhesive material for semiconductor devices with high reliability as such a thermoresistance adhesive has excellent moisture resistance, mechanical properties and α-ray shielding properties in use as a buffer coat for semiconductor chips. Further, the thermoresistance adhesive solution of this invention, as worked into a paste, shows excellent continuous printability and low-temperature curing properties due to selective use of a solvent of high volatility and low hygroscopicity, hence high environmental safety, such as γ-butyrolactone, so that it is useful as an adhesive material for semiconductor devices with high productivity and reliability. The thermoresistance adhesive and thermoresistance adhesive solution of the present invention have high adhesive strength under shear to lead frame and semiconductor chip, and are useful as an adhesive material for high-reliability semiconductor devices. The thermoresistance adhesive of this invention which does not dissolve at the molding temperature of 120 to 200° C. has general-purpose properties and is useful as an adhesive material for semiconductor devices with excellent operatability and reliability.

The thermoresistance resin paste of the present invention is capable of bonding (especially heat bonding) a chip and a lead frame and proof against package cracking in solder reflowing, can afford thixotropic properties with no need of using any non-dissoluble filler such as inorganic filler, and is also capable of forming high-reliability, uniform thick-film pattern by screen printing. Further, the thermoresistance resin paste of this invention, by use of a solvent of high volatility and low hygroscopicity, hence high environmental safety, is capable of realizing excellent continuous printability and low-temperature curing properties as a paste, and is useful as an adhesive material for semiconductor devices with high productivity and reliability. Furthermore, the thermoresistance resin paste of the present invention enables formation of thick-film, high-fineness pattern on the substrate, so that it useful as an adhesive material for low-cost semiconductor devices with high productivity.

The semiconductor chip having a thermoresistance adhesive layer according to the present invention has excellent productivity as the thermoresistance adhesive layer can serve as a buffer coat. Also, with the semiconductor chip having a thermoresistance adhesive layer according to the present invention, it is possible to form a thermoresistance adhesive layer with a high-fineness pattern by the printing method with high coating efficiency, and as coating is made only on a specified area of the semiconductor chip unlike in the conventional spin coating method in which coating is made over the whole surface of semiconductor wafer, it is possible to minimize warpage of the wafer and to offer the high-productivity, low-cost semiconductor devices.

The lead frame having a thermoresistance adhesive layer according to the present invention can be bonded to a semiconductor chip with a small quantity of thermoresistance adhesive, making it possible to provide low-cost semiconductor devices.

The film having a thermoresistance adhesive layer according to the present invention makes it possible to offer a semiconductor device which is minimized in contamination of connecting circuits and has high reliability as this film releases no volatile matter such as solvent when heat bonded to a semiconductor chip.

The semiconductor device according to the present invention is proof against early exfoliation of package at the interface between the sealer and the thermoresistance adhesive and against package cracking in infrared reflowing after moisture absorption, and thus has high package reliability.

The thermoresistance resin paste producing process of the present invention is capable of imparting thixotropic properties to the paste without using a filler such as fine silica particles or non-dissoluble polyimide particles, can form a high-reliability, uniform thick-film pattern free of voids or air cells by screen printing, and is further characterized by minimized contamination with dirt and other ionic impurities and high productivity. Thus, the process is capable of producing a thermoresistance resin paste which is suited for use as an adhesive for LOC of semiconductor devices, and as a layer insulating film, protective film and adhesive for various types of wiring boards and semiconductor devices.

What is claimed is:

1. A process for producing a thermoresistance resin paste, which comprises mixing (I) a heat-resistant resin A soluble in a solvent of (III) at room temperature and at a temperature used for heat drying, (II) fine particles of a heat-resistant resin B which is insoluble in the solvent of (III) at room temperature but soluble at a temperature used for heat drying, and (III) a solvent, heating the mixture for dissolution, and cooling the obtained solution to deposit or disperse the fine particles of the heat-resistant resin B of (II) in the solution of the heat-resistant resin A of (I) and the solvent of (III).

2. The process according to claim 1, wherein the fine particles of the heat-resistant resin B of (II) are deposited and dispersed in the solution of the heat-resistant resin A of (I) and the solvent of (III) with the maximal size of said resin B particles being defined to 10 µm or less.

3. The process according to claim 1, wherein the heat-resistant resin A is a polyimide resin or a precursor thereof, a polyamide-imide resin or a precursor thereof, or a polyamide resin.

4. The process according to claim 1, wherein the heat-resistant resin B is A polyimide resin or a precursor thereof, a polyamide-imide resin or a precursor thereof, or a polyamide resin.

5. The process according to claim 1, wherein the heat-resistant resin A is a polyimide resin or a precursor thereof, a polyamide-imide resin or a precursor thereof, or a polyamide resin and the heat-resistant resin B is a polyimide resin or a precursor thereof, a polyamide-imide resin or a precursor thereof, or a polyamide resin.

* * * * *